(12) United States Patent
Tanaka

(10) Patent No.: US 6,590,254 B2
(45) Date of Patent: Jul. 8, 2003

(54) NONVOLATILE SEMICONDUCTOR MEMORY DEVICE AND METHOD OF MANUFACTURING THE SAME

(75) Inventor: Motoko Tanaka, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/860,345

(22) Filed: May 18, 2001

(65) Prior Publication Data

US 2001/0044184 A1 Nov. 22, 2001

(30) Foreign Application Priority Data

May 19, 2000 (JP) ........................................ 2000-148837

(51) Int. Cl.[7] ............................................ H01L 29/788
(52) U.S. Cl. ....................................................... 257/315
(58) Field of Search ........................................... 257/315

(56) References Cited

U.S. PATENT DOCUMENTS 5,946,230 A * 8/1999 Shimizu et al. ............. 257/314
5,994,733 A * 11/1999 Nishioka et al. ............ 257/315
6,353,242 B1 * 3/2002 Watanabe et al. ........... 257/208

FOREIGN PATENT DOCUMENTS

JP          11102960 A   *  4/1999

* cited by examiner

Primary Examiner—Wael Fahmy
Assistant Examiner—Howard Weiss
(74) Attorney, Agent, or Firm—Choate, Hall & Stewart

(57) ABSTRACT

A nonvolatile semiconductor memory device, wherein a poly-silicon film is formed on the entire surface of a memory cell region and a peripheral circuit region, and the poly-silicon film on an element isolating insulation film between the gate insulation films of the memory cell region is selectively removed to form a floating gate base layer. Subsequently, an ONO film is formed on the entire surface, and the poly-silicon film and the ONO film is removed from the peripheral circuit region. A conductive film is then formed on the entire surface, a control gate and a floating gate patterned, and a gate electrode then patterned, although at this point, the ONO film and the poly-silicon film are removed from a boundary region, and when the gate electrode is formed, the element isolating insulation film is carved out and a groove is formed in the region where the conductive film is removed by etching.

17 Claims, 17 Drawing Sheets

PERIPHERAL CIRCUIT REGION S1 | BOUNDARY REGION S3 | MEMORY CELL REGION S2

NONVOLATILE SEMICONDUCTOR MEMORY DEVICE AND METHOD OF MANUFACTURING THE SAME

BACKGROUND OF THE INVENTION

1. Field of the Invention

The present invention relates to a nonvolatile semiconductor memory device with a memory cell region and a peripheral circuit region and a method of manufacturing such a device, and more particularly to a nonvolatile semiconductor memory device designed to prevent variations in the characteristics of transistors in the peripheral circuit region and a method of manufacturing such a device.

2. Description of the Related Art

FIG. 1A is a plan view showing a conventional nonvolatile semiconductor memory device, and FIG. 1B is a cross-sectional view taken along a line L—L in FIG. 1A. Furthermore, FIG. 2A and FIG. 2B through to FIG. 7A and FIG. 7B show the sequence of steps for a method of manufacturing a conventional nonvolatile semiconductor memory device.

As shown in FIG. 1A and FIG. 1B, an element isolating insulation film 114 is formed on the surface of a silicon substrate 110, and a peripheral circuit region S4 and a memory cell region S5 are isolated each other by the element isolating insulation film 114. Within the peripheral circuit region S4, the element isolating insulation film 114 is also formed around a transistor formation region, and a gate insulation film 126 is formed on the silicon substrate 110 in this region surrounded by the element isolating insulation film 114. In addition, a gate electrode 134 is formed on the gate insulation film 126, and one end of this gate electrode 134 is formed so as to extend out over the element isolating insulation film 114. Within the memory cell region S5, a plurality of strip-like regions are partitioned off by the element isolating insulation film 114, and a gate insulation film 112 is formed on the silicon substrate 110 in these strip-like regions. A control gate 130 is then formed from a plurality of lines which extend in a direction perpendicular to the lengthwise direction of these strip-like gate insulation films 112, and the tips of every second control gate line are then connected to form a comb shaped pattern. The base layer of the control gate 130 comprises a floating gate 120a formed on the gate insulation film 112, and an ONO film (a three layer construction comprising a silicon oxide film, a silicon nitride film, and another silicon oxide film) 124 formed thereon. A diffusion layer (not shown in the drawings) is formed on the surface of the silicon substrate 110 below the gate insulation film 112 in the region where the floating gate 120a is formed, and this diffusion layer is shared between adjacent memory elements. Furthermore, a dummy pattern 136 is formed between the peripheral circuit region S4 and the memory cell region S5, and during operation of the nonvolatile semiconductor memory device this dummy pattern 136 is connected to GND.

As follows is a description of a method of manufacturing a conventional nonvolatile semiconductor memory device. As shown in FIG. 2A and FIG. 2B, an element isolating region 114 is formed on the surface of a p-type silicon substrate 110, surrounding both the transistor formation region of the peripheral circuit region S4 and the memory element formation region of a memory circuit region. A gate insulation film 112 is then formed on the silicon substrate 110 in the aforementioned transistor formation region and memory element formation region, and a first poly-silicon film is subsequently formed on the entire surface. A resist film is then formed with a resist pattern 118 which is opened with the exception of the regions above the gate insulation films 112 of the peripheral circuit region S4 and the memory cell region S5. This resist pattern 118 is then used as a mask for patterning the first poly-silicon film of the memory cell region S5, and forming a base layer 120 of a floating gate electrode of the memory cell region S5. At this point, the poly-silicon film 116 of the peripheral circuit region S4 is not removed, as it prevents the ion injection used for forming a channel stopper in the subsequent process. Channel stopper ions are then injected using the resist pattern 118, the poly-silicon film 116 and the base layer 120 as a mask. In this process, because the silicon substrate 110 is a p-type substrate, boron (B) ions which are capable of forming a p-type region of the same type of conductivity as the silicon substrate 110 are injected. This ion injection process is conducted for the following reasons. Namely, as the width of the element isolating region 114 for isolating memory elements decreases with increasing miniaturization of the memory cells, the thickness of the element isolating region decreases in comparison with other element isolating regions of a sufficiently large size. This decrease in thickness produces adverse effects such as a deterioration in the isolating capabilities, allowing current to flow between adjacent channels. In order to prevent such effects, a p-type region known as a channel stopper, with a higher concentration than the silicon substrate 110, is formed in the internal section and the lower section of the element isolating region 114.

Subsequently, following removal of the resist pattern 118, a resist pattern 122 is formed which covers the floating gate base layer 120 of the memory cell region S5, and the poly-silicon film 116 in the peripheral circuit region S4 is removed by dry etching, as shown in FIG. 3A and FIG. 3B. In order to ensure that the resist pattern 122 formed in the memory cell region S5 results in the removal of all of the poly-silicon film 116 of the peripheral circuit region S4, the resist pattern 122 should be formed so that the edge on the side of the peripheral circuit region S4 does not overlap with the edge of the poly-silicon film 116 on the side of the memory cell region S5. When the poly-silicon film 116 is removed, a portion of the gate insulation film 112 underneath the poly-silicon film 116 is also removed. The gate insulation film 112 of the peripheral circuit region S4 is then removed completely using wet etching.

Subsequently, following removal of the resist pattern 122, an ONO film 124 is formed on the entire surface, as shown in FIG. 4. This ONO film 124 is an insulation film preventing the escape of electric charge retained by the floating gate electrode of the memory elements.

The ONO film 124 is optimized for film formation on top of the floating gate electrode, but is unsuitable as a gate insulation film for the transistors of the peripheral circuit region S4. Consequently, a resist pattern 125 is formed which is opened above the peripheral circuit region S4, and this resist pattern 125 is then used as a mask to remove the ONO film 124 in the peripheral circuit region S4, as shown in FIG. 5A and FIG. 5B. The removal of the ONO film 124 can utilize either dry etching removal methods or wet etching removal methods. Gate oxidation is then carried out, forming a gate insulation film 126 in the peripheral circuit region S4, and the resist pattern 125 is then removed.

Subsequently, a second poly-silicon film is formed on the entire surface, and a further resist film then formed thereon, forming a resist pattern 128 which covers the peripheral circuit region S4 but is opened above the memory cell region S5 with the exception of the control gate electrode formation region. The control gate 130 of the memory cell region S5 then undergoes patterning, as shown in FIG. 6A and FIG. 6B. The control gate 130 is formed on the floating gate 120*a* with the ONO film 124 disposed therebetween. A region 138 where the second poly-silicon film has been removed by patterning is carved into the element isolating region 114 underneath. The resist pattern 128 is then removed.

Finally, as shown in FIG. 7A and FIG. 7B, a resist pattern 132 is formed which covers the memory cell region S5 but is opened above the peripheral circuit region S4 with the exception of the gate electrode formation region. This resist pattern 132 is then used as a mask for patterning the second poly-silicon film and forming the gate electrode 134 of the peripheral circuit region S4. At this time, in order to prevent etching of the element isolating region 114 in the region 138 and a consequent reduction in the thickness of the element isolating film, the resist pattern 132 covering the memory cell region S5 is formed so that the edge of the resist pattern 132 on the side of the peripheral circuit region S4 covers the region 138. As a result, a dummy pattern 136 formed from the second poly-silicon film remains between the memory cell region S5 and the peripheral circuit region S4. This dummy pattern 136 is formed surrounding the memory cell region S5, and during use of the nonvolatile semiconductor memory device is connected to GND.

However, in this conventional manufacturing method, because either dry etching or wet etching is used for removing the ONO film 124 from the peripheral circuit region S4, the following types of problems arise.

In the case of dry etching, over etching may result in etching of not only the gate insulation film 112 of the peripheral circuit region S4, but also of the silicon substrate 110 positioned underneath, leading to a carving out of the surface of the silicon substrate 110. This type of over etching can occur because the etching rates for the nitride film and the oxide film which make up the ONO film 124 are substantially the same, and so leaving just the oxide film is difficult. Etching of the silicon substrate within the gate insulation film formation region can cause various problems, including a deterioration in the withstand voltage of the gate, current leakage at the field edge, and reductions in the ON current of the transistor.

In contrast, in the case of wet etching, the use of a nitride film etching solution enables a difference in etching rates to be established for the nitride film and the oxide film. However, when using a nitride film wet etching solution, the resist does not function as a mask, and so an oxide film for masking must be formed instead. However, when this masking oxide film is removed, the uppermost oxide film layer of the ONO film 124 of the memory cell region S5 is also removed. Removal of this uppermost oxide film layer of the ONO film 124 from the memory cell region S5 can cause various problems, including variations in the operating characteristics of the nonvolatile memory, and deterioration in the product yield.

Furthermore, in this conventional manufacturing method, because the resist pattern 128 of the resist film used in the formation of the control gate electrode 130, and the resist pattern 132 of the resist film used in the formation of the peripheral circuit gate electrode 134 overlap, a portion of the second poly-silicon film between the memory cell region S5 and the peripheral circuit region S4 remains, forming a dummy pattern 136. This dummy pattern 136 is a wasted region in the chip layout and causes an increase in the chip region.

SUMMARY OF THE INVENTION

An object of the present invention is to provide a nonvolatile semiconductor memory device capable of preventing deterioration in the characteristics of transistors formed in a peripheral circuit region and the characteristics of memory elements of a memory cell region without increasing the chip region, and a method of manufacturing such a memory device.

A nonvolatile semiconductor memory device according to the present invention comprises a memory cell region in which is formed a plurality of memory elements with a floating gate formed from a first conductive film, an insulation film formed on the floating gate, and a control gate formed from a second conductive film on top of the insulation film; a peripheral circuit region with a transistor with a gate electrode formed from the aforementioned second conductive film for controlling the aforementioned memory elements; an element isolating insulation film formed between the memory cell region and the peripheral circuit region; and a groove formed at the surface of the aforementioned element isolating insulation film during formation of the control gate.

The aforementioned insulation film may have a silicon oxide film, a silicon nitride film and another silicon oxide film.

A method of manufacturing a nonvolatile semiconductor memory device according to the present invention is a method of manufacturing a nonvolatile semiconductor memory device with a memory cell region and a peripheral circuit region. The method comprises the steps of forming an element isolating insulation film on a semiconductor substrate surface and forming a first gate insulation film on the portion of the silicon substrate surrounded by the element isolating insulation film; forming a first conductive film for a floating gate on the entire surface, selectively removing sections of the first conductive film by using as a mask a first resist film with a first opening positioned above the element isolating insulation film of the aforementioned memory cell region, and forming a floating gate base layer; forming a channel stopper by using the aforementioned first resist film and the first conductive film as a mask and injecting an impurity of the same type of conductivity as the silicon substrate; forming an insulation film on the entire surface; reforming a second gate insulation film by using as a mask a second resist film with a second opening exposing the aforementioned peripheral circuit, and selectively removing sections of the insulation film, the aforementioned first conductive film, and the first gate insulation film from the peripheral circuit region; forming a floating gate and a control gate by forming a second conductive film on the entire surface, and then using a third resist film with a third opening above the aforementioned memory cell region as a mask, and patterning the first conductive film and the second conductive film respectively; and forming a gate electrode by using a fourth resist film with a fourth opening above the aforementioned peripheral circuit region as a mask, and patterning the second conductive film in the peripheral circuit region; wherein there is a predetermined spacing between the edge of the aforementioned second opening on the side of the memory cell region, and the edge of the aforementioned third opening on the peripheral circuit region side.

According to the present invention, when the insulation film of the peripheral circuit region is removed using the second resist film as a mask, because the first conductive film is formed underneath the insulation film, the silicon substrate is in no danger of over etching, and so the characteristics of the transistors formed in the peripheral circuit region suffer no deterioration. Furthermore, because the memory cell region side edge of the second opening formed in the second resist film used for removing the insulation film and the first conductive film of the peripheral circuit region, and the peripheral circuit region side edge of the third opening formed in the third resist film used for forming the control gate do not overlap in the region between the peripheral circuit region and the memory cell region, a dummy pattern surrounding the memory cell region is not formed between the peripheral circuit region and the memory cell region as in conventional examples, and so increases in chip size can be suppressed.

The step of removing the aforementioned first resist film and forming an insulation film on the entire surface may comprise steps of sequentially layering a silicon oxide film, a silicon nitride film and a silicon oxide film. Furthermore, the memory elements may be positioned in the memory cell region in a matrix arrangement, with the element isolating insulation film of the memory cell region isolating the columns of memory elements, and the aforementioned first opening then formed as a strip-like region which extends between the columns of memory elements in the direction of the columns. In addition, the present invention may also comprise a step of patterning the first conductive film and the second conductive film with the third resist film as a mask and forming the floating gate and the control gate respectively, as well as patterning the first conductive film, the insulation film and the second conductive film at the location covering the lengthwise edges of the first opening and forming a dummy pattern. As a result, when the control gate is formed, the insulation film formed on the side wall sections of the first conductive film above the element isolating insulation film has sufficient height so as to be not completely removed, and leaves residues. Those residues between the lines of the control gate are adhered to the control gate at both ends, and the residues outside the control gate are adhered to the control gate at one end and the dummy pattern at the other end, and consequently these residues will not peel off from the element isolating insulation film during subsequent steps.

BRIEF DESCRIPTION OF THE DRAWINGS

FIG. 3A is a plan view showing the step following the step shown in FIG. 2, and FIG. 3B is a cross-sectional view taken along a line N—N in FIG. 3A;

FIG. 5A is a plan view showing the step following the step shown in FIG. 4, and FIG. 5B is a cross-sectional view taken along a line O—O in FIG. 5A;

FIG. 6A is a plan view showing the step following the step shown in FIG. 5, and FIG. 6B is a cross-sectional view taken along a line P—P in FIG. 6A;

FIG. 7A is a plan view showing the step following the step shown in FIG. 6, and FIG. 7B is a cross-sectional view taken along a line Q—Q in FIG. 7A;

FIG. 11A is a plan view showing the step following the step shown in FIG. 10, and FIG. 11B is a cross-sectional view taken along a line E—E in FIG. 11A;

FIG. 12A is a plan view showing the step following the step shown in FIG. 11, and FIG. 12B is a cross-sectional view taken along a line F—F in FIG. 12A;

FIG. 13A is a plan view showing the step following the step shown in FIG. 12, and FIG. 13B is a cross-sectional view taken along a line G—G in FIG. 13A;

FIG. 14A is a plan view showing the step following the step shown in FIG. 13, and FIG. 14B is a cross-sectional view taken along a line H—H in FIG. 14A;

FIG. 15A is a plan view, and

FIG. 15B and

DETAILED DESCRIPTION OF THE PREFERRED EMBODIMENT

Figure 1A:
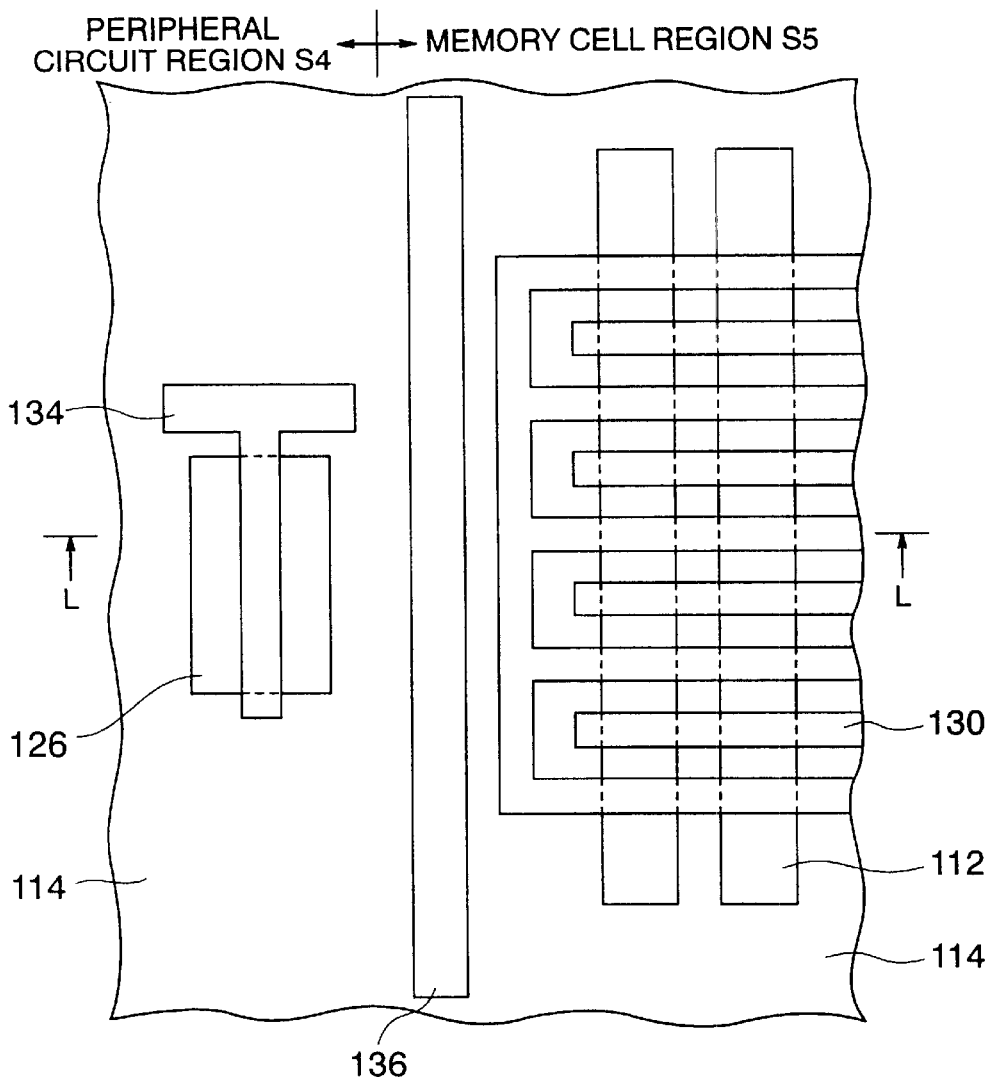
FIG. 1A is a plan view showing a conventional nonvolatile semiconductor memory device.
Figure 1B:
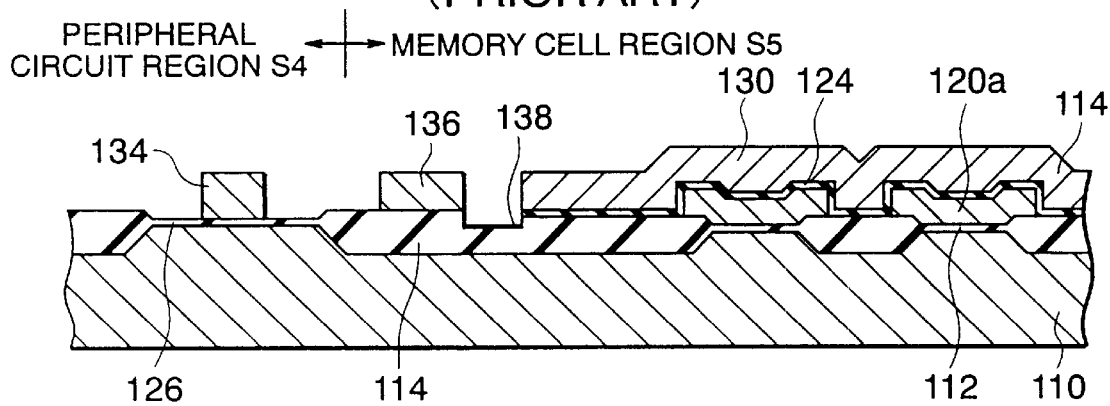
FIG. 1B is a cross-sectional view taken along a line L—L in FIG. 1A.
Figure 2A:
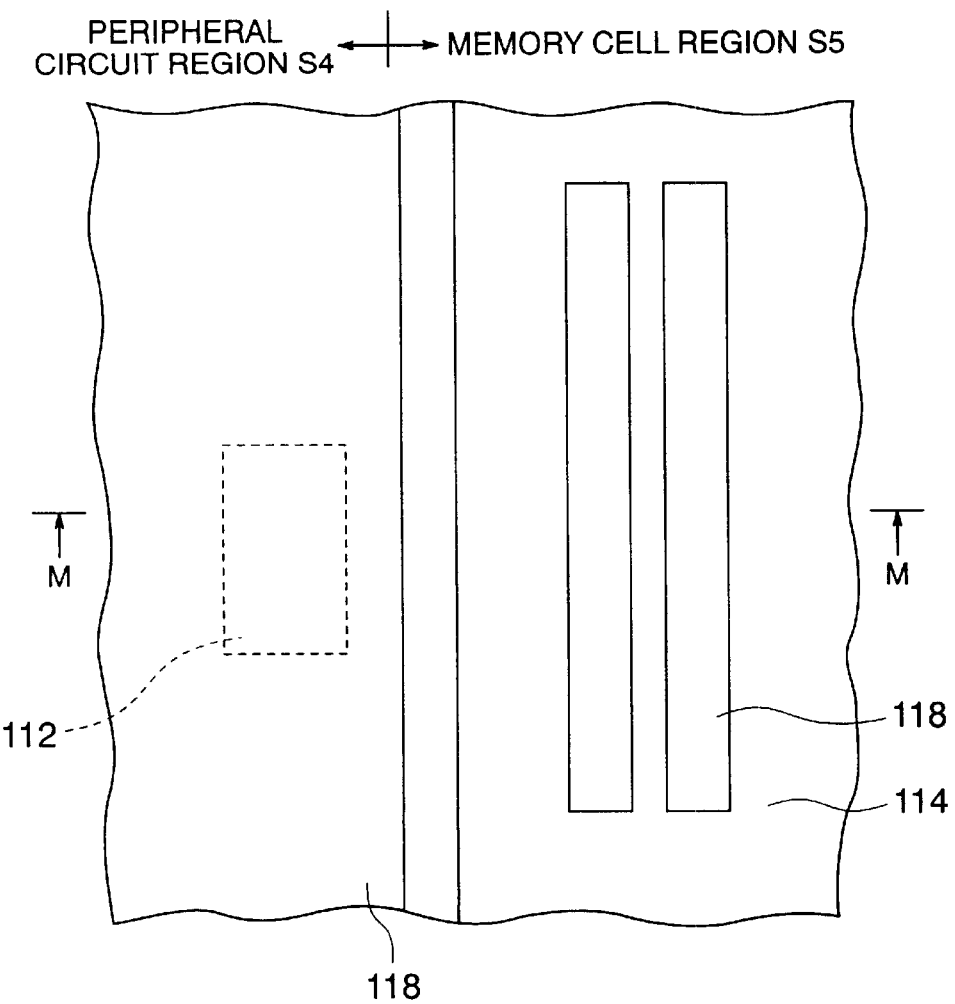
FIG. 2A is a plan view showing one step in a method of manufacturing a conventional nonvolatile semiconductor memory device.
Figure 2B:
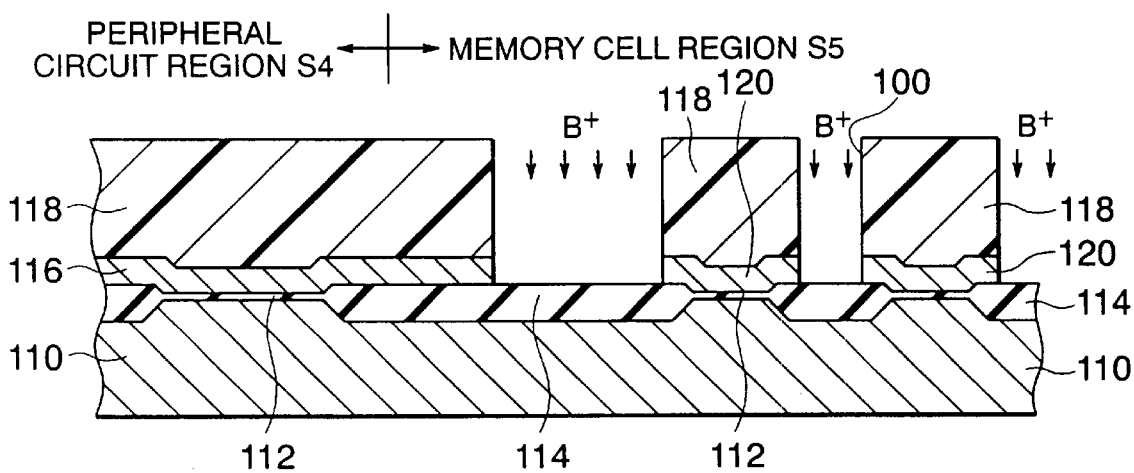
FIG. 2B is a cross-sectional view taken along a line M—M in FIG. 2A.
Figure 3A:
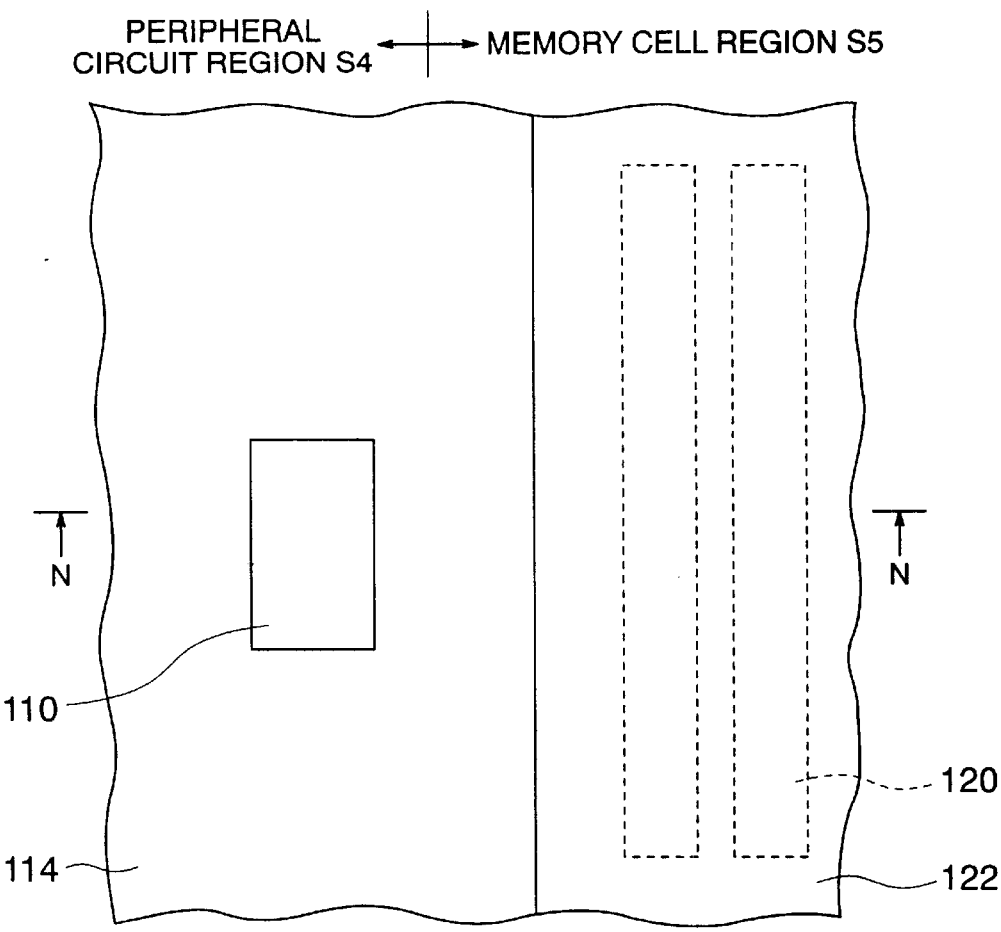
FIG. 3A and FIG. 3B are diagrams showing one step in a method of manufacturing a conventional nonvolatile semiconductor memory device, where
Figure 3B:
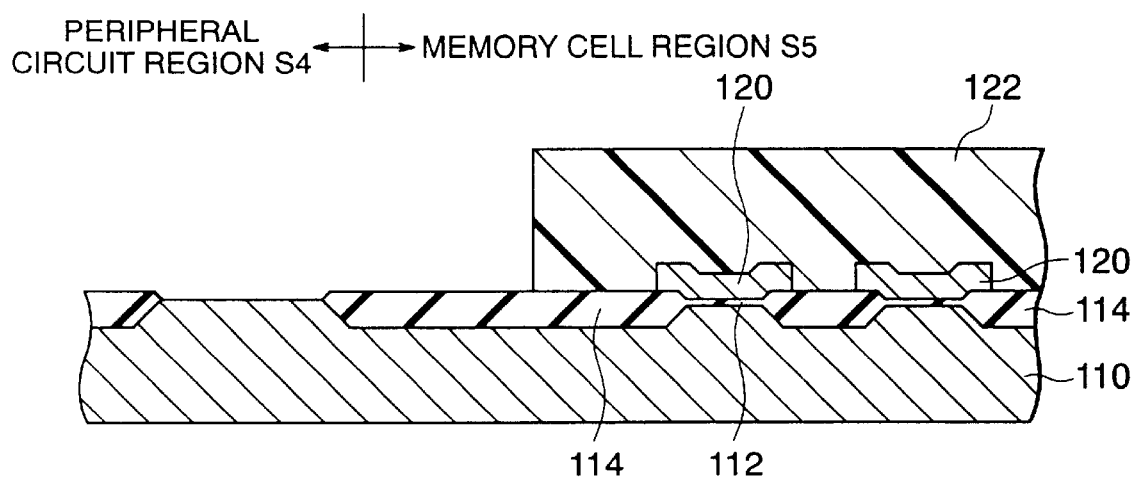
Figure 4:
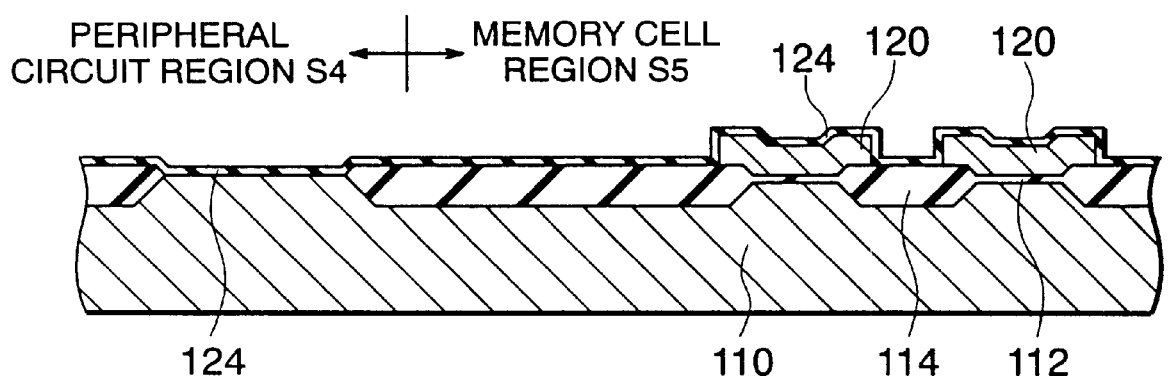
FIG. 4 is a cross-sectional view showing one step in a method of manufacturing a conventional nonvolatile semiconductor memory device.
Figure 5A:
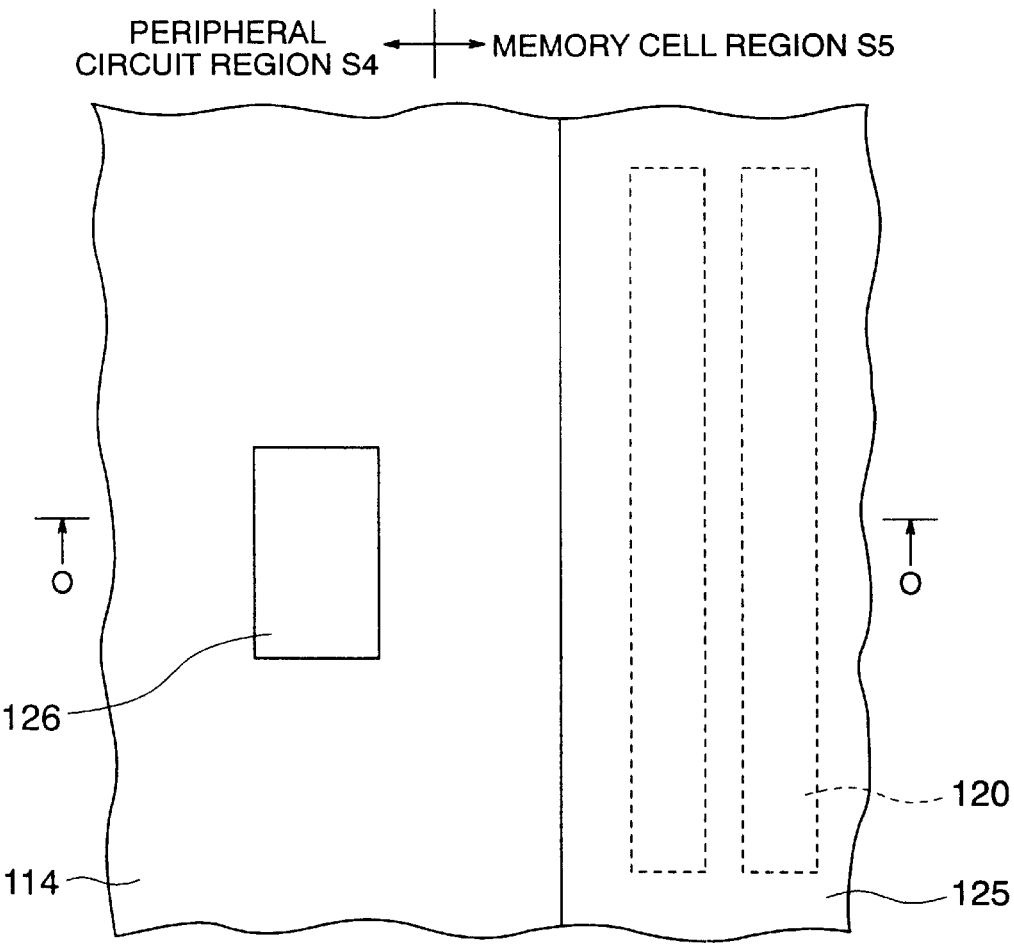
FIG. 5A and FIG. 5B are diagrams showing one step in a method of manufacturing a conventional nonvolatile semiconductor memory device, where
Figure 5B:
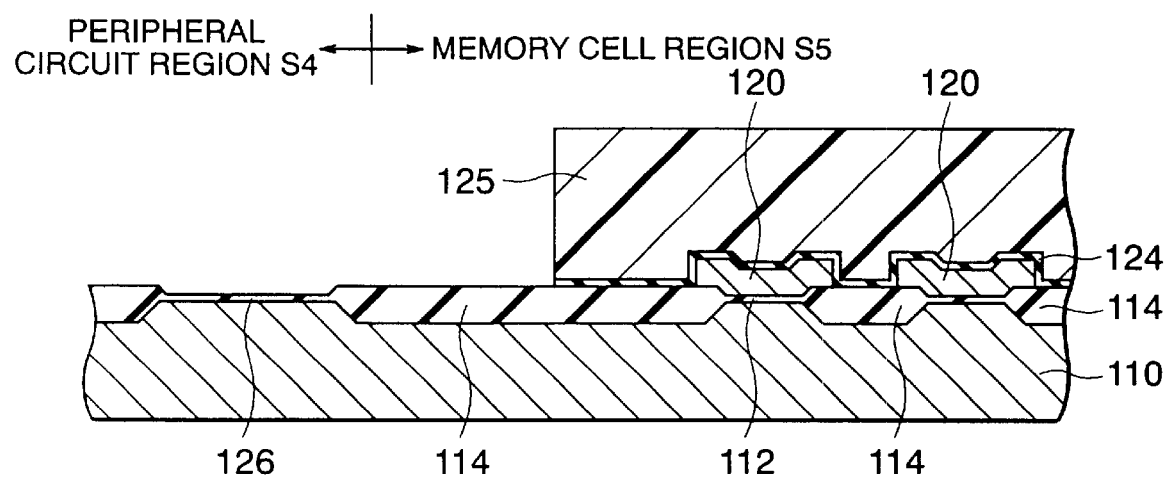
Figure 6A:
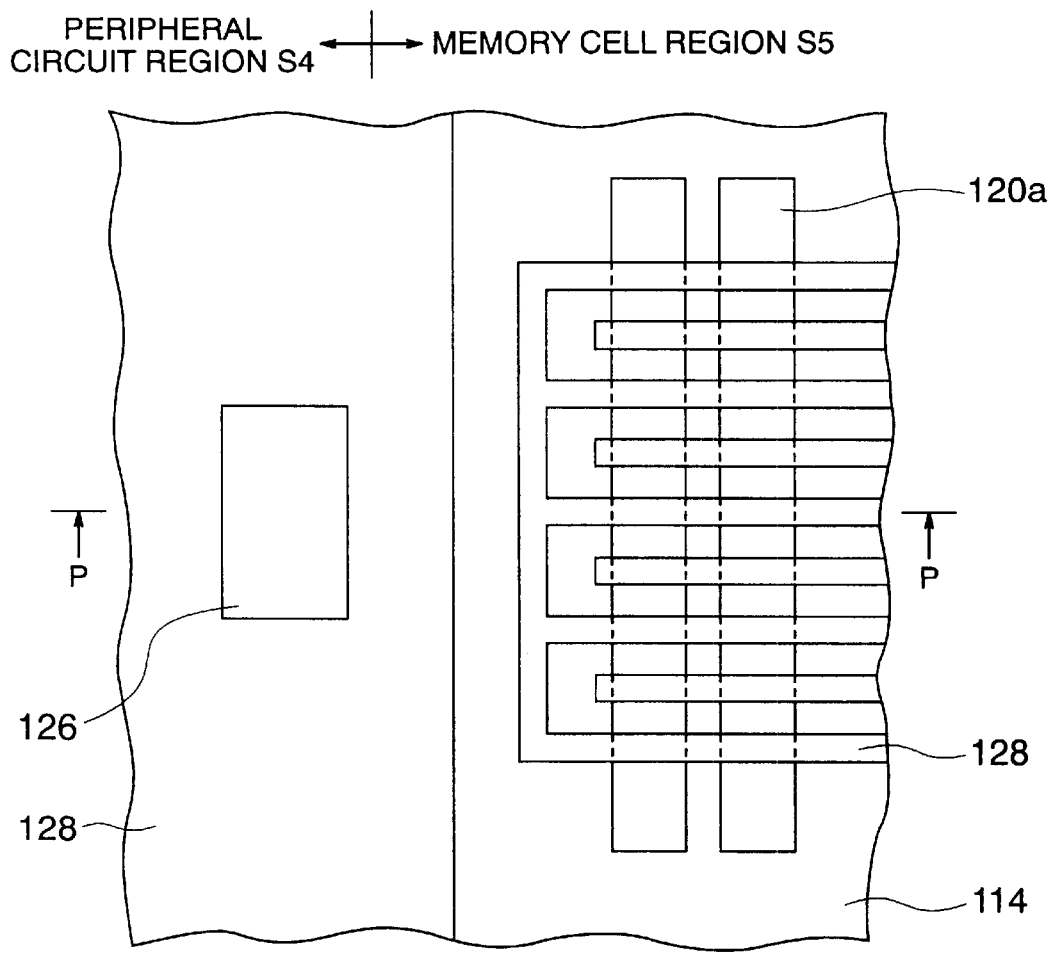
FIG. 6A and FIG. 6B are diagrams showing one step in a method of manufacturing a conventional nonvolatile semiconductor memory device, where
Figure 6B:
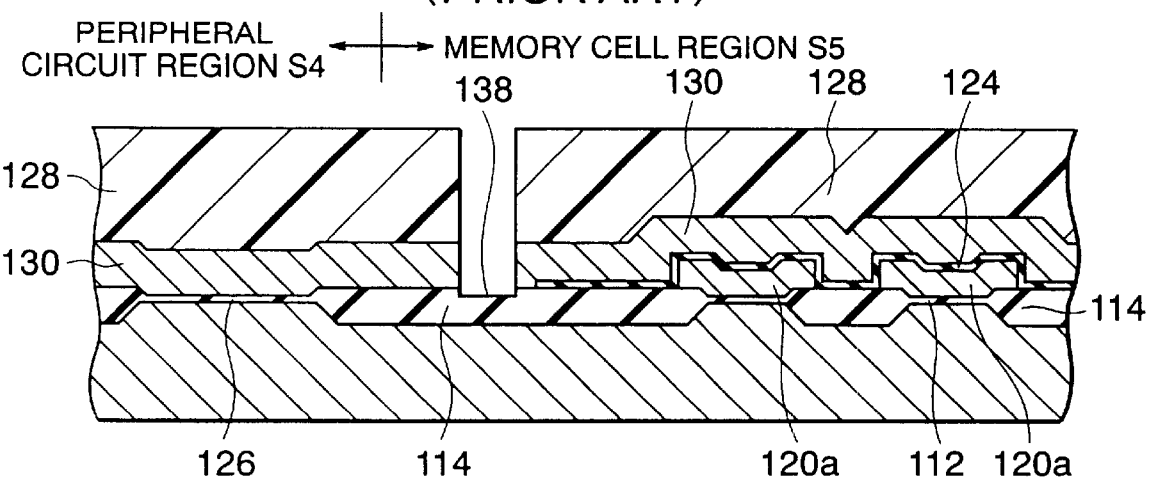
Figure 7A:
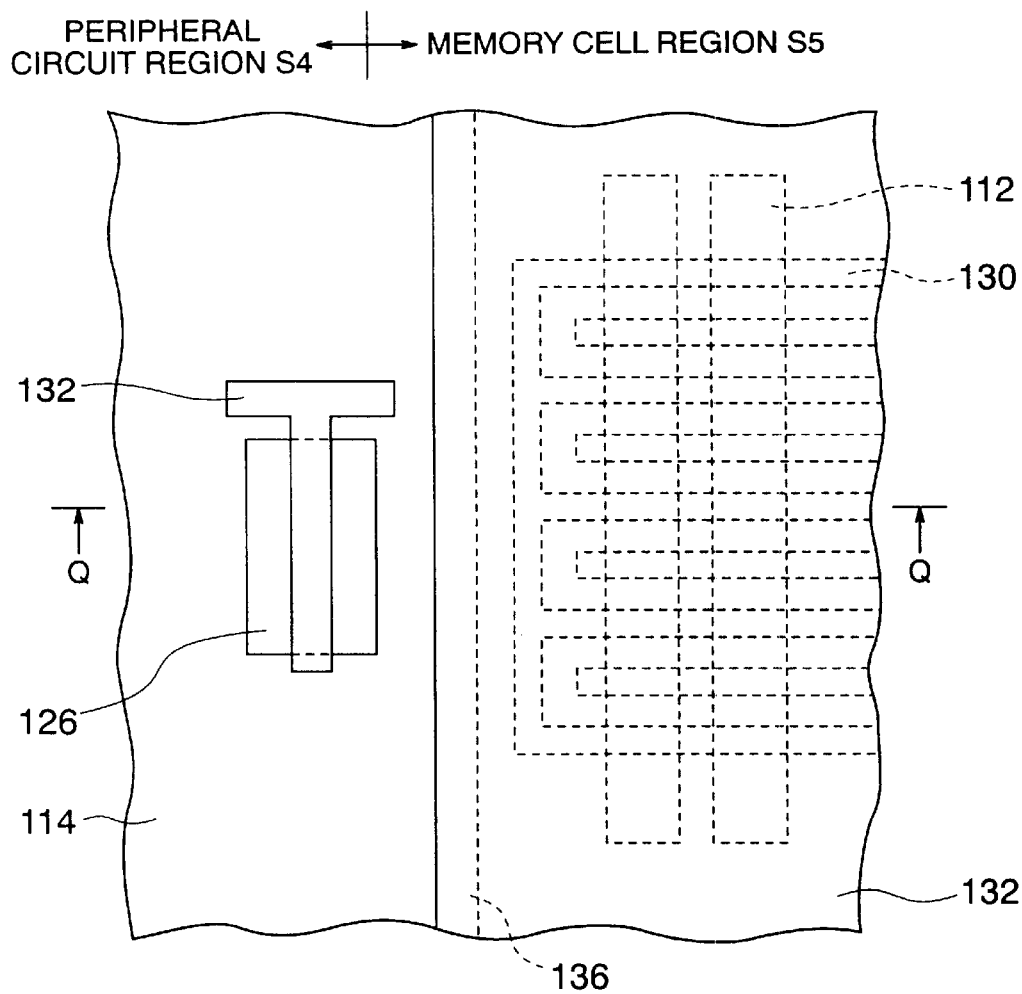
FIG. 7A and FIG. 7B are diagrams showing one step in a method of manufacturing a conventional nonvolatile semiconductor memory device, where
Figure 7B:
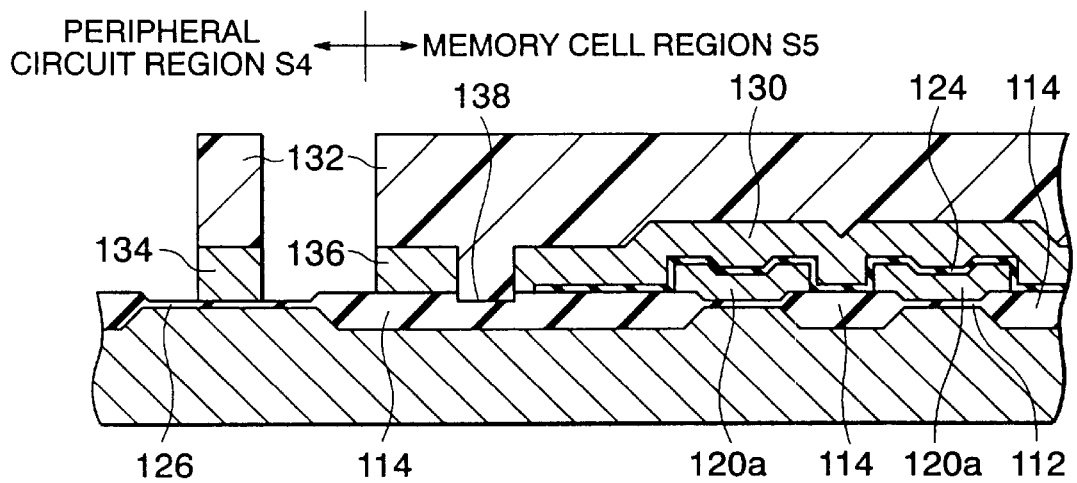
Figure 8A:
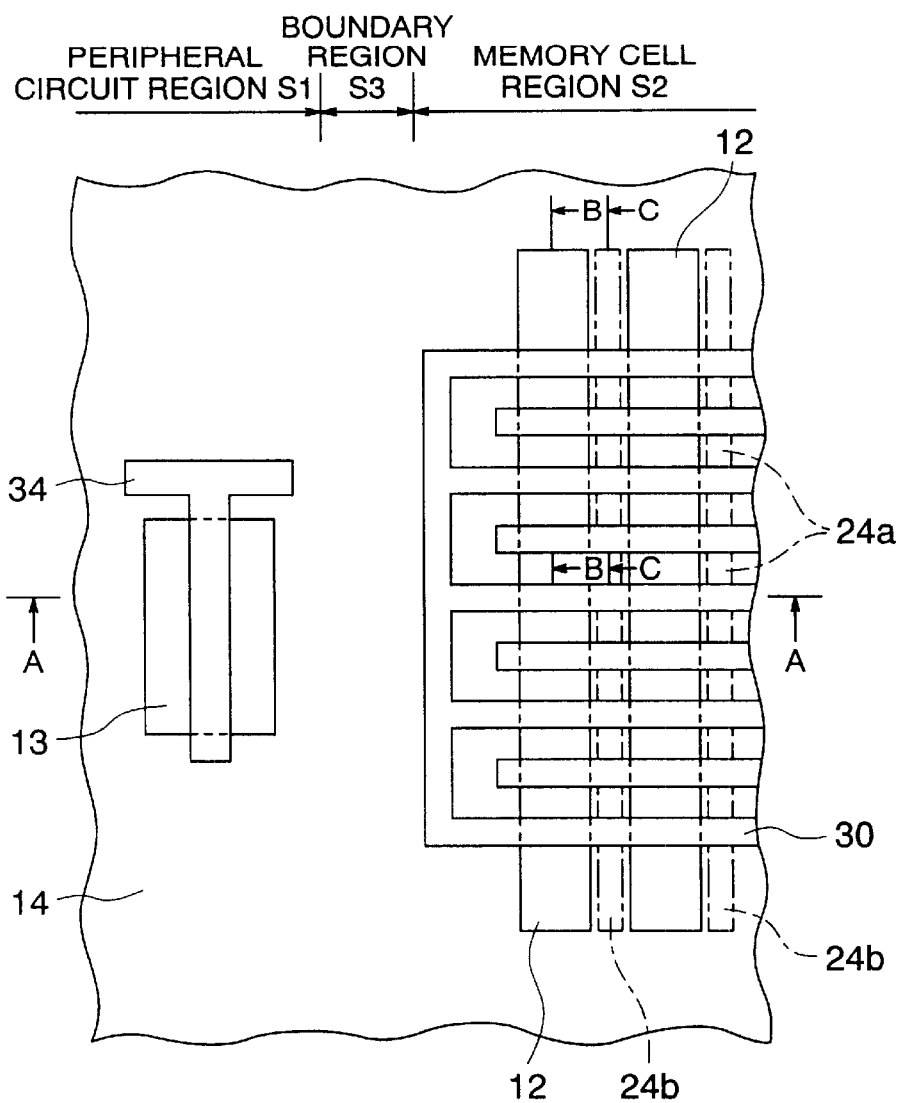
FIG. 8A is a plan view showing a nonvolatile semiconductor memory device according to a first embodiment of the present invention.
Figure 8B:
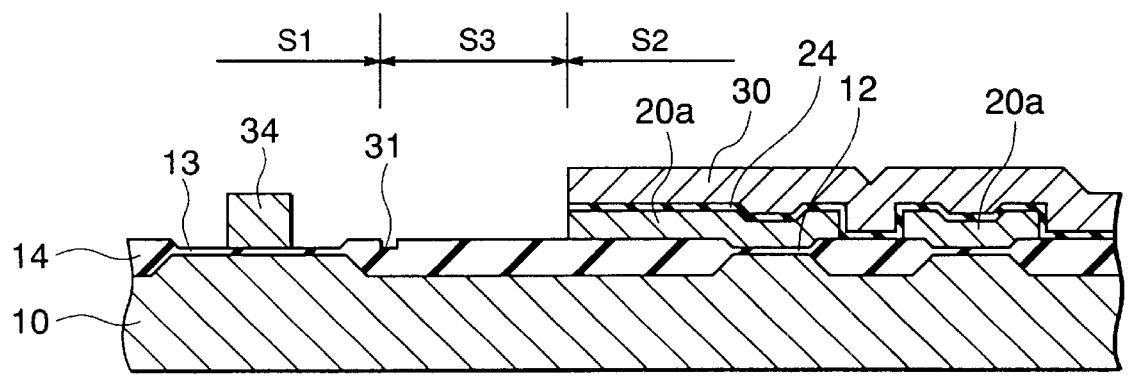
FIG. 8B is a cross-sectional view taken along a line A—A in FIG. 8A.
Figure 9A:
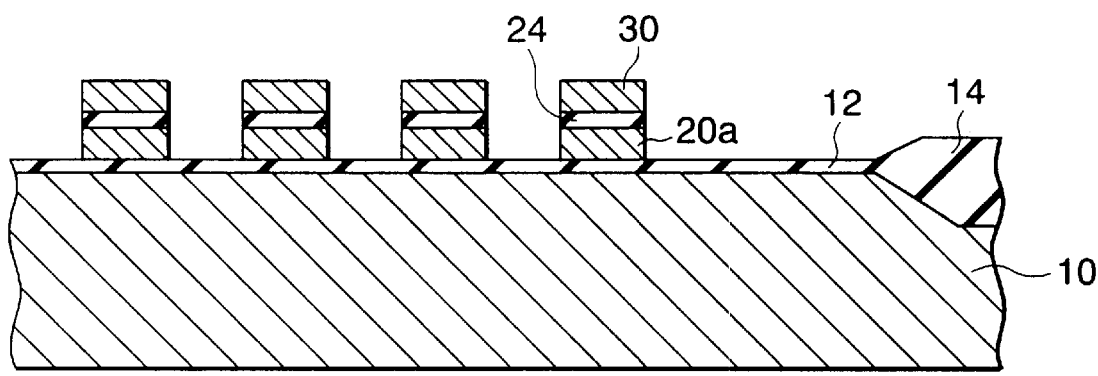
FIG. 9A and FIG. 9B are cross-sectional views taken along a line B—B and a line C—C respectively in FIG. 8A.
Figure 9B:
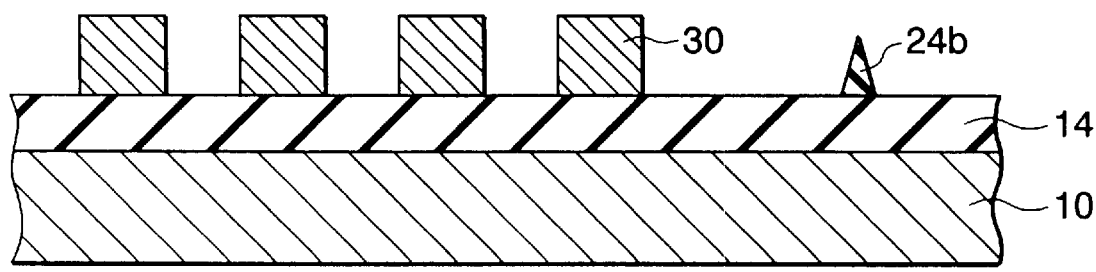

As follows, embodiments of the present invention will be described in detail, with reference to the accompanying drawings. FIG. 8A is a plan view showing a nonvolatile semiconductor memory device according to a first embodiment of the present invention, and FIG. 8B is a cross-sectional view taken along a line A—A in FIG. 8A. Furthermore, FIG. 9A and FIG. 9B are cross-sectional views taken along a line B—B and a line C—C respectively in FIG. 8A.

As shown in FIG. 8A and FIG. 8B, an element isolating insulation film 14 is formed on the surface of a silicon substrate 10, and a memory cell region S2 and a peripheral circuit region S1 are isolated by the element isolating insulation film 14. In the memory cell region S2, a plurality of parallel strip-like regions are partitioned off by the element isolating insulation film 14, and a gate insulation film 12 is formed on the silicon substrate 10 in these strip-like regions. A control gate 30 is then formed from a plurality of lines which run in a direction perpendicular to the lengthwise direction of the strips on which the gate insulation film 12 has been formed. The control gate 30 is formed in a comb shape where the tips of every second control gate line are connected. A floating gate 20a which functions as a base layer for the control gate 30 is then formed on the gate insulation film 12, and an ONO film 24 is then formed on the floating gate 20a. In this first embodiment, immediately following the step for forming the control gate 30 and the floating gate 20a, ONO film residues 24a, 24b are formed along the edges of the element isolating insulation film 14 in those regions between the regions of gate insulation film 12 where the control gate 30 has not been formed. Both ends of the ONO film residues 24a formed inside the region occupied by the control gate 30 are adhered to the control gate 30. Furthermore, the ONO film residues 24b formed outside the region occupied by the control gate 30 are formed in a horseshoe shape which spans the element isolating insulation film 14 in the gap between adjacent regions of the gate insulation film 12. However, in steps following the formation of the control gate 30, when an insulation film for forming a diffusion layer formation side wall to function as a source/drain region for a memory element of an LDD (Lightly Doped Drain) construction is formed and then etched, the ONO film residues 24a, 24b are eliminated. In this manner, memory elements are formed in a matrix arrangement in the memory cell region, and a diffusion layer of the column memory elements is shared between memory elements.

In the peripheral circuit region S1, a gate insulation (silicon oxide) film 13 is formed on the silicon substrate 10 in the region surrounded by the element isolating insulation film 14, and a gate electrode 34 is formed on top of this gate insulation film 13. Both ends of the gate electrode 34 extend out from above the gate insulation film 13 to positions above the element isolating insulation film 14, and one end of the gate electrode 34 also extends out in opposite directions perpendicular to the lengthwise direction of the gate electrode 34, forming a T shape when viewed from above. In this first embodiment, a region between the peripheral circuit region S1 side edge of the control gate 30 formed in the memory cell region S2, and the memory cell region S2 side edge of the gate electrode 34 formed in the peripheral circuit region S1 is designated as a boundary region S3. In this boundary region S3, a region 31 carved into the surface of the element isolating insulation film 14 surrounds the memory cell region S2. As described below, this region 31 is generated during the formation of the control gate 30.

Figure 10A:
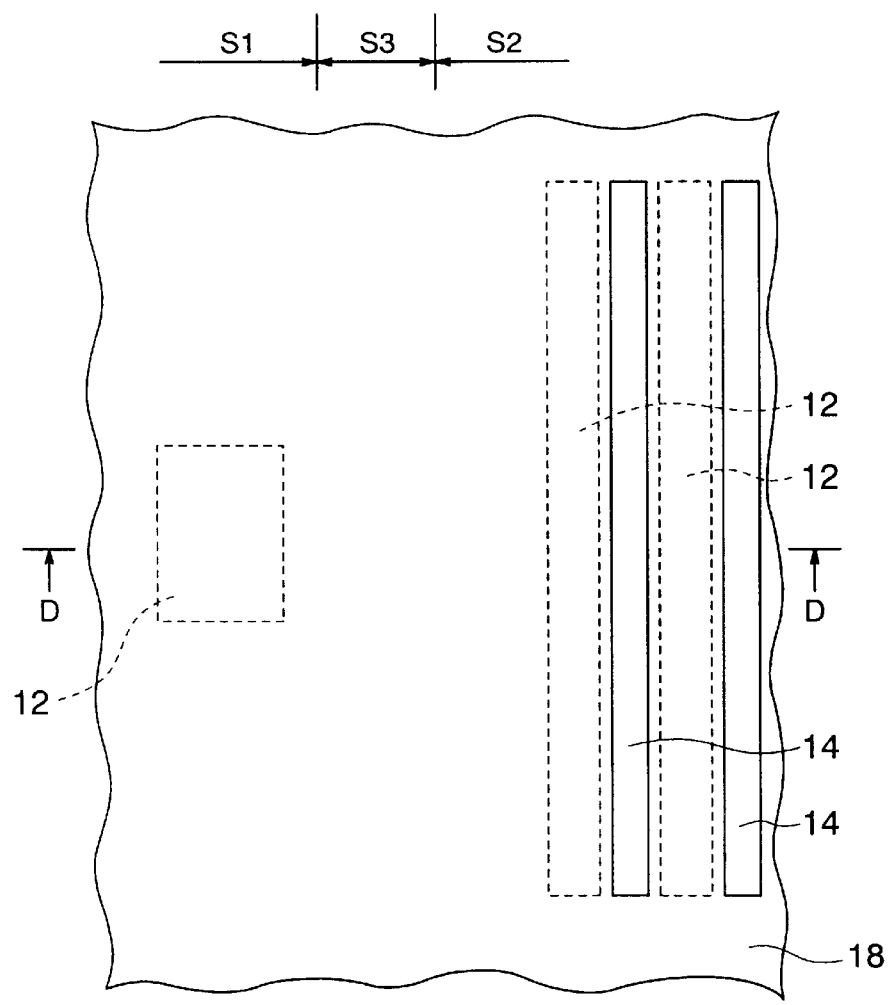
FIG. 10A is a plan view showing one step in a method of manufacturing the nonvolatile semiconductor memory device according to the first embodiment of the present invention.
Figure 10B:
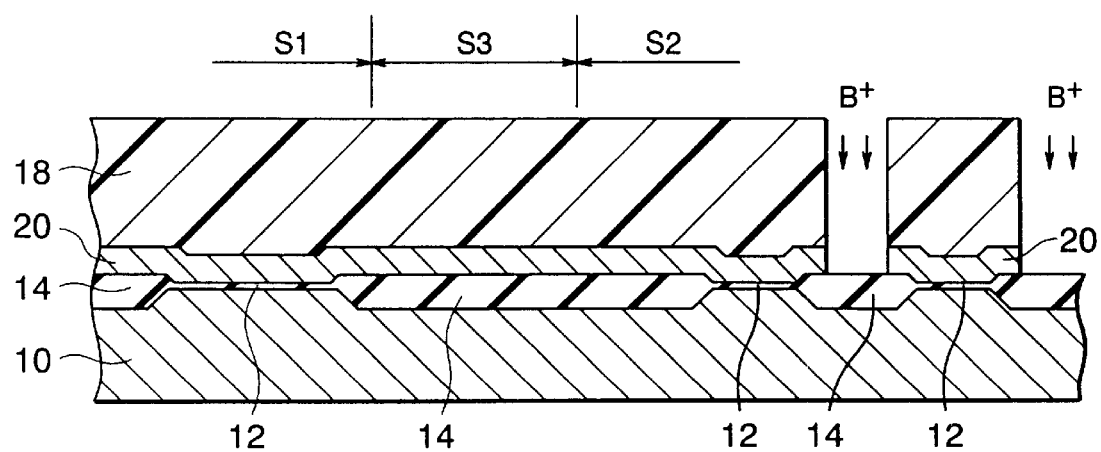
FIG. 10B is a cross-sectional view taken along a line D—D in FIG. 10A.

As follows is a description of a method of manufacturing a nonvolatile semiconductor memory device of the first embodiment described above. FIG. 10A and FIG. 10B through to FIG. 14A and FIG. 14B are diagrams showing the sequence of steps in this manufacturing method, where FIG. 10A to FIG. 14A are plan views, and FIG. 10B to FIG. 14B are cross-sectional views taken along the lines D—D to H—H respectively.

As shown in FIG. 10A and FIG. 10B, an element isolating insulation film 14 is formed on the surface of a silicon substrate 10, and a gate insulation film 12 is formed on the silicon substrate 10 in element regions surrounded by the element isolating insulation film 14. A first poly-silicon film is then formed on the entire surface, and a resist film and a resist pattern (a first resist film) 18 then formed on the poly-silicon film. The resist pattern 18 has a plurality of strip shaped openings which extend in a parallel manner over only those regions between the memory elements of the memory cell region S2. Using the resist pattern 18 as a mask, only the memory cell region S2 undergoes patterning, forming a floating gate base layer 20. In this manner, when the first poly-silicon film undergoes patterning in the present invention, the first poly-silicon film is only removed from the regions between the memory elements of the memory cell region S2. This limited removal should result in the effects shown below. Namely, in those cases where HSG (hemispherical grained silicon) is formed on a poly-silicon film in which only the regions between memory elements have been removed, then because the surface region of poly-silicon film is large, the memory cell region S2 is positioned quite distant from the edges of the poly-silicon film, and if an ONO film 24 is formed using a CVD method, then the thickness of the ONO film 24 formed on the floating gate of the memory elements of the memory cell region S2 is uniform, thereby enabling variations in the memory cell characteristics to be suppressed. The reason for this effect is that although when an ONO film 24 is formed using CVD methods the film thickness thereof is surface region dependent, with the edges of the ONO film 24 being thicker and the central regions of the ONO film 24 being thinner, if the ONO film 24 is formed on a base layer with a large surface region, then because the memory elements of the memory cell region S2 are formed in positions distant from the edges of the poly-silicon film of the base layer 20, the surface region dependency problems associated with CVD methods can be avoided. Next, before the resist pattern 18 is removed, channel stopper ions are injected. Following removal of the resist pattern 18, an ONO film 24 of a three layer construction comprising a silicon oxide film, a silicon nitride film and another silicon oxide film, which functions as an insulation film, is formed on the entire surface.

Figure 11A:
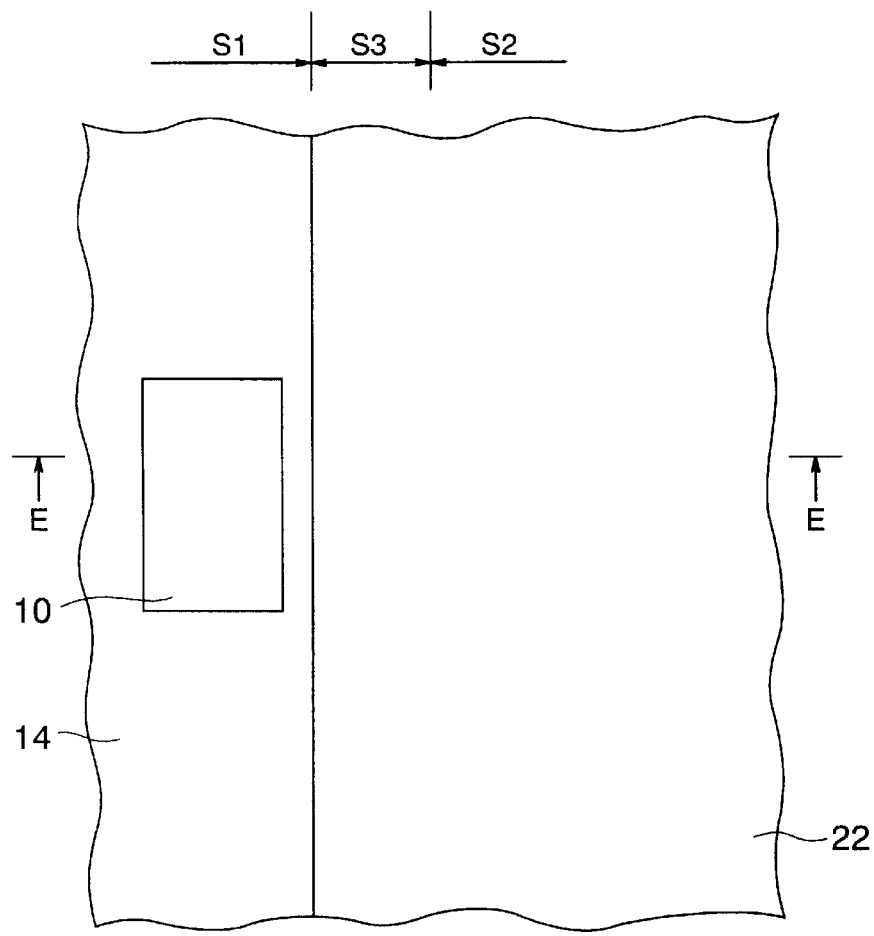
FIG. 11A and FIG. 11B are diagrams showing one step in a method of manufacturing the nonvolatile semiconductor memory device according to the first embodiment of the present invention, where
Figure 11B:
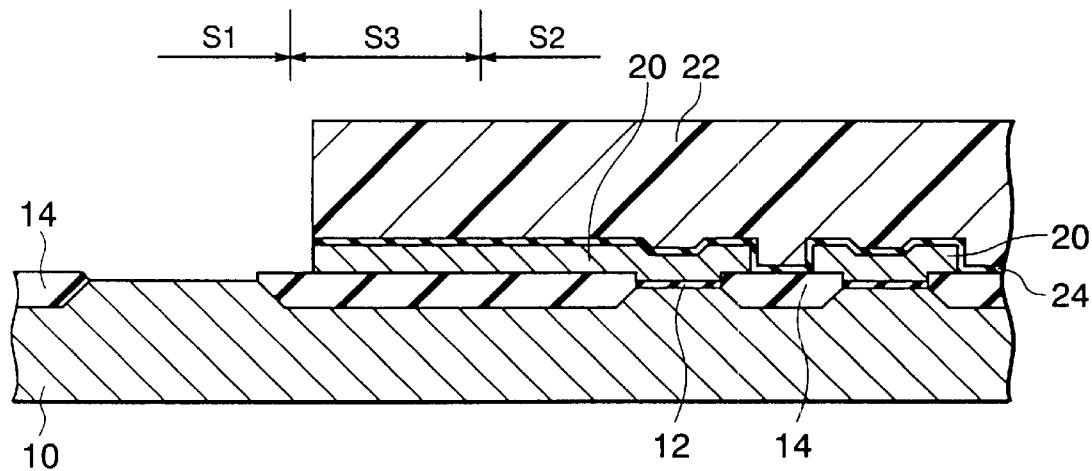

As shown in FIG. 11A and FIG. 11B, a resist pattern 22 is then formed which exposes the peripheral circuit region S1 and covers the memory cell region S2, and the ONO film 24 and the poly-silicon film is removed from all regions outside the memory cell region S2 using dry etching. At this point, the gate insulation film 12 of the peripheral circuit region S1 is also removed, and so wet etching is used to ensure complete removal of the gate insulation film 12.

Figure 12A:
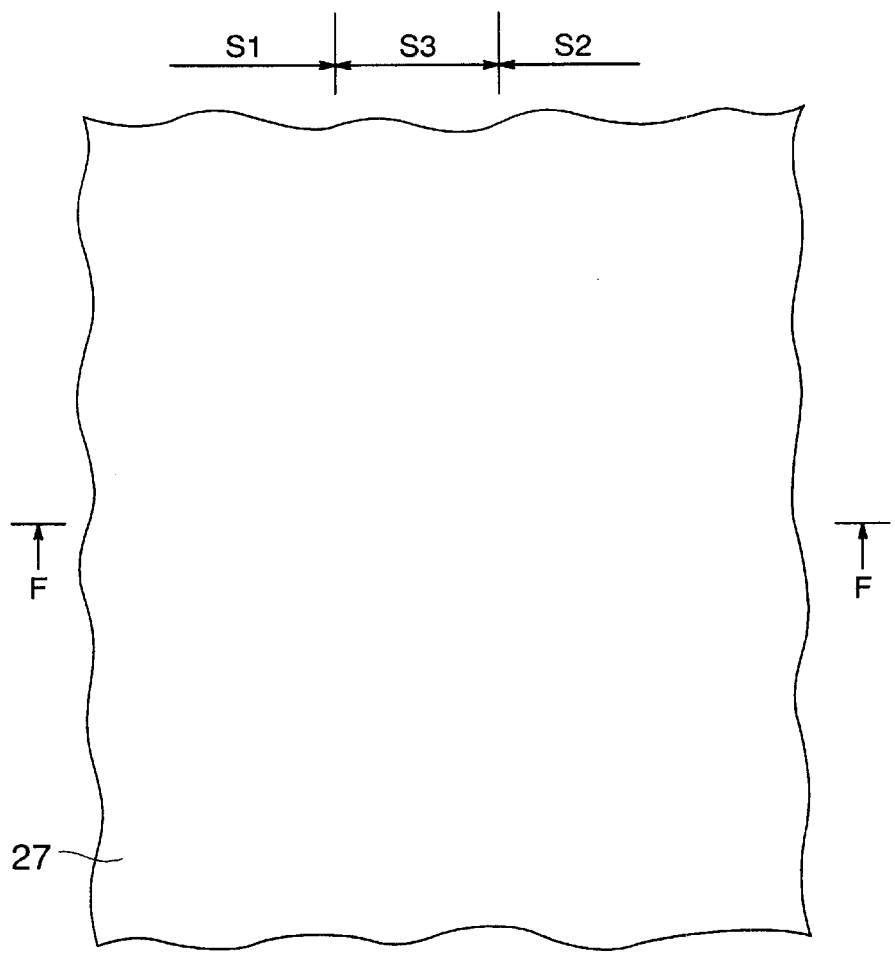
FIG. 12A and FIG. 12B are diagrams showing one step in a method of manufacturing the nonvolatile semiconductor memory device according to the first embodiment of the present invention, where
Figure 12B:
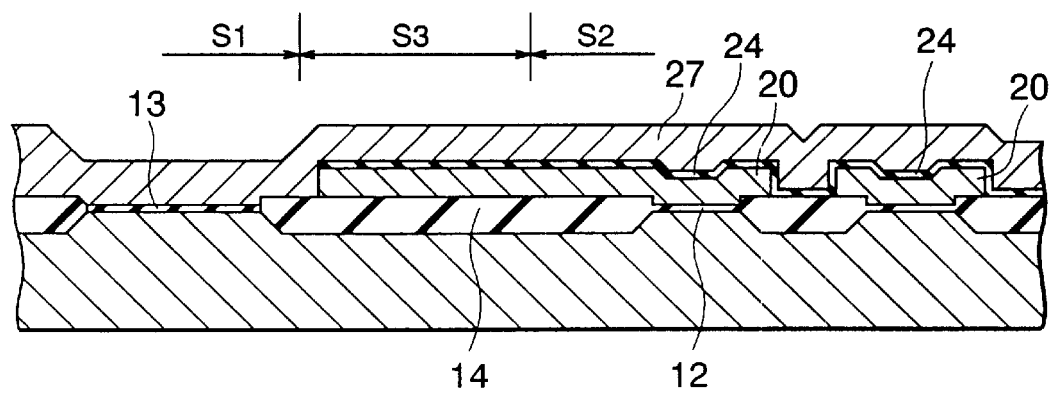

Subsequently, as shown in FIG. 12A and FIG. 12B, a new gate insulation film 13 is reformed in the peripheral circuit region S1. Then, following removal of the resist pattern 22, a two-layered conductive film 27, having for example a poly-silicon film as the bottom layer and a high melting point metal silicide as the top layer, is formed on the entire surface.

Figure 13A:
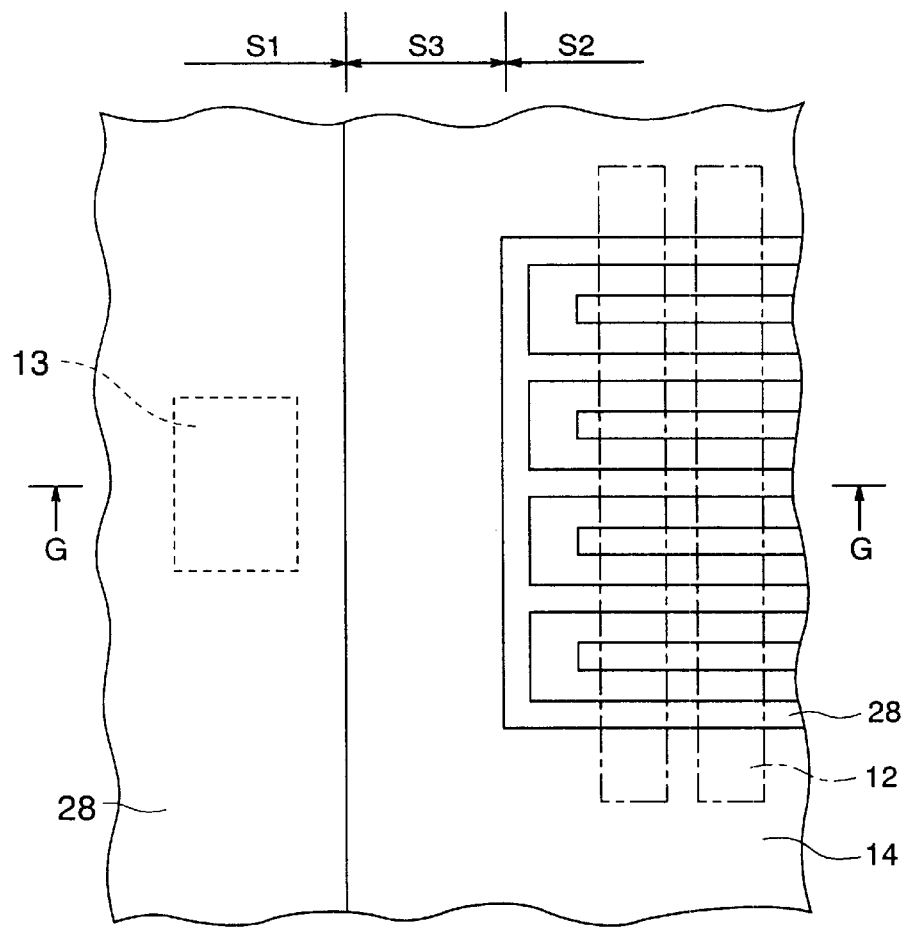
FIG. 13A and FIG. 13B are diagrams showing one step in a method of manufacturing the nonvolatile semiconductor memory device according to the first embodiment of the present invention, where
Figure 13B:
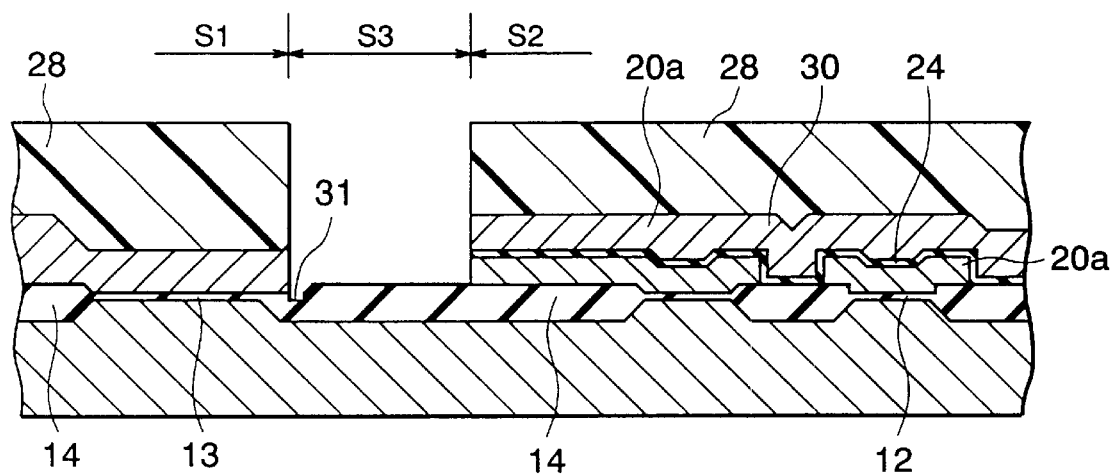
Figure 14A:
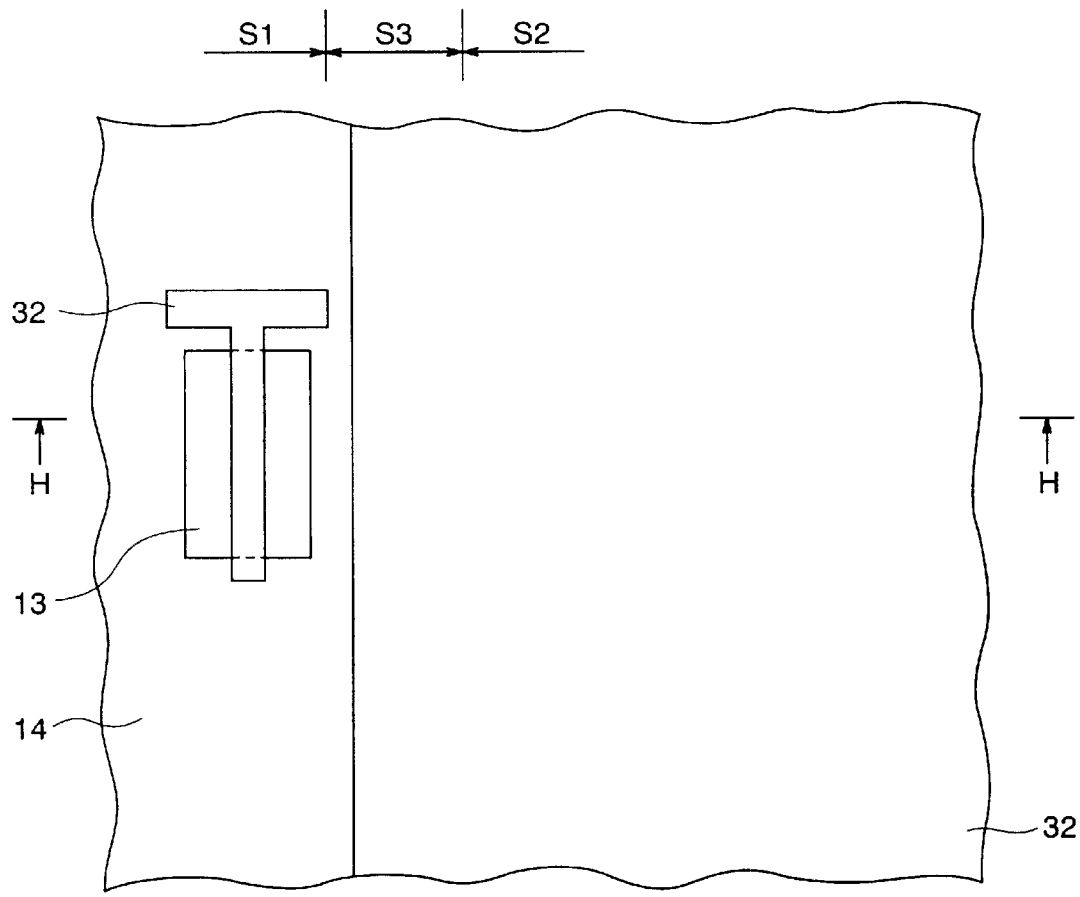
FIG. 14A and FIG. 14B are diagrams showing one step in a method of manufacturing a nonvolatile semiconductor memory device according to the first embodiment of the present invention, where
Figure 14B:
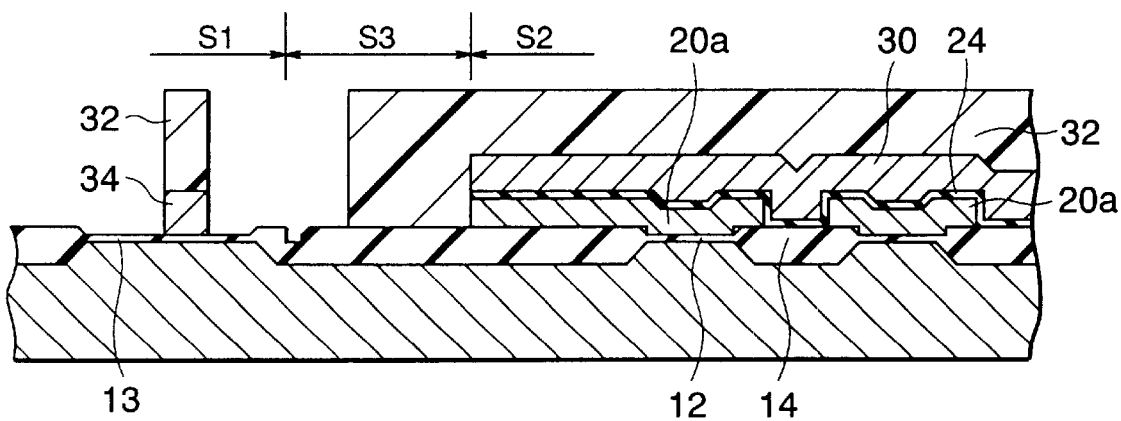

Then, as shown in FIG. 13A and FIG. 13B, a resist pattern 28 is formed which covers the entire peripheral circuit region S1 and exposes the conductive film 27 with the exception of the control gate formation region of the memory cell region S2. This resist pattern 28 is then used as a mask for patterning the control gate 30 in the memory cell region S2. In order to ensure complete removal of the first poly-silicon film formed in the boundary region S3, the memory cell region S2 side edge of the resist pattern 28 in the peripheral circuit region S1 should be formed so as not to overlap the first poly-silicon film of the boundary region S3. As a result, the peripheral circuit region S1 side edge of the resist pattern 22 covering the memory cell region S2 shown in FIG. 11A and FIG. 11B, and the memory cell region S2 side edge of the resist pattern 28 covering the peripheral circuit region S1 shown in FIG. 12A and FIG. 12B, are designed with a separation of at least a certain distance within the boundary region S3. By so doing, the element isolating insulation film 14 is carved out in a region within the boundary region S3 which is not covered by the resist pattern 28 and in which the first poly-silicon film is not present beneath the two-layered conductive film 27, forming the groove 31. This groove 31 is formed because during dry etching, following removal of the two-layered conductive film 27 and during etching of the ONO film 24, there is no difference in etching rates between the oxide film of the ONO film 24 and the oxide film of the element isolating insulation film 14. However in subsequent steps, interlayer insulation film fills in the groove 31, so the appearance of the groove 31 at this point does not adversely effect the circuit characteristics. Furthermore, at this point, the ONO film 24 formed on the side wall of the first poly-silicon film of the memory cell region S2 is not removed due to the thickness of the first poly-silicon film and the height of the side wall, and remains as a trace on the first poly-silicon film, forming the ONO film residues 24a, 24b shown in FIG. 8A. The resist pattern 28 is subsequently removed.

Next, as shown in FIG. 14A and FIG. 14B, a resist pattern 32 is formed which covers the memory cell region S2, but is opened above the peripheral circuit region S1 with the exception of the gate electrode formation region. This resist pattern 32 is then used as a mask for patterning, within the peripheral circuit region S1, the two-layered conductive film 27 in which the lower layer is a poly-silicon film and the upper layer is a high melting point metal silicide, forming the gate electrode 34.

Subsequently, typical methods are used for performing ion injection of phosphorus or the like into the gate insulation film 12 of the memory cell region S2. The entire surface is then covered with an insulation film, and this insulation film subjected to an etch back process to form side walls for the control gate and the floating gate. As a result, the ONO film residues 24a, 24b are removed. Arsenic or the like is then ion injected into the gate insulation film of the memory cell, forming memory elements of an LDD construction. Furthermore, ion injection is also carried out into both sides of the gate electrode 34 of the peripheral circuit region S1, forming a diffusion layer.

Figure 15A:
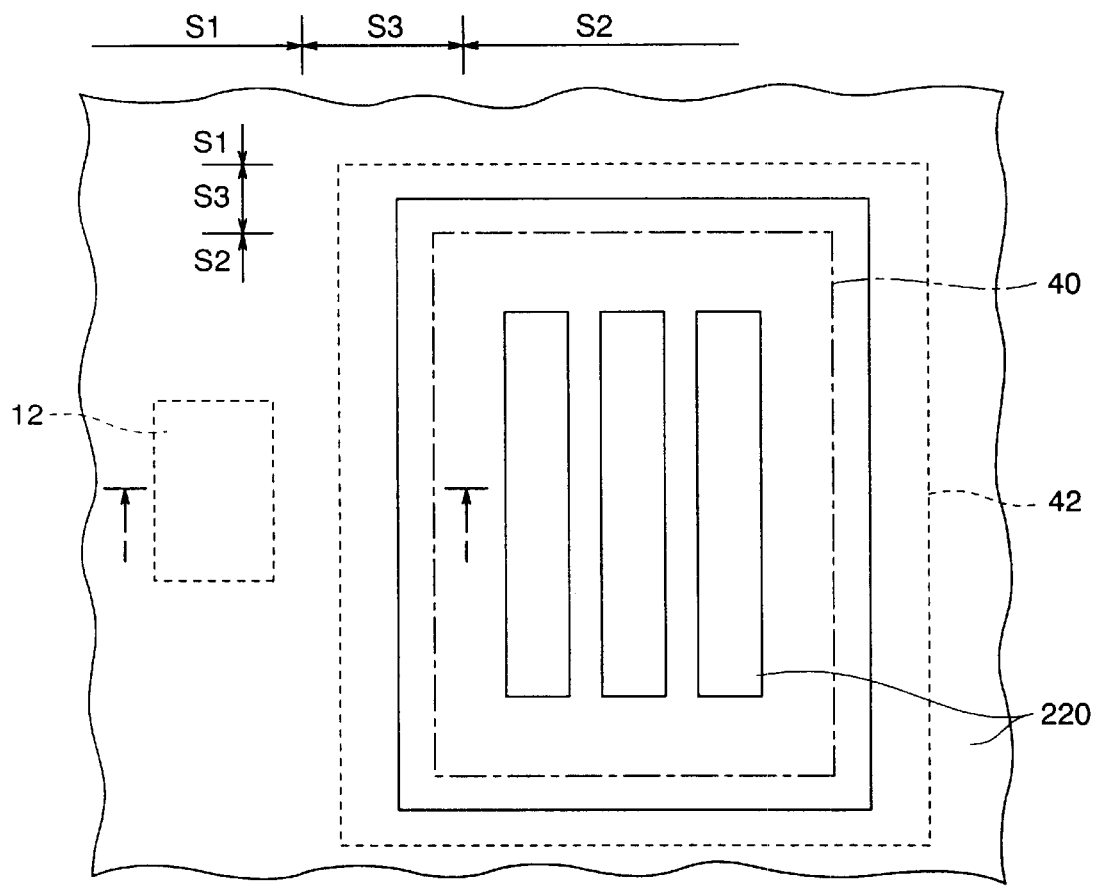
FIG. 15A and FIG. 15B are diagrams showing one step in a method of manufacturing a nonvolatile semiconductor memory device according to a technique disclosed in Japanese Patent Application No. Hei 11-016612, where
Figure 15B:
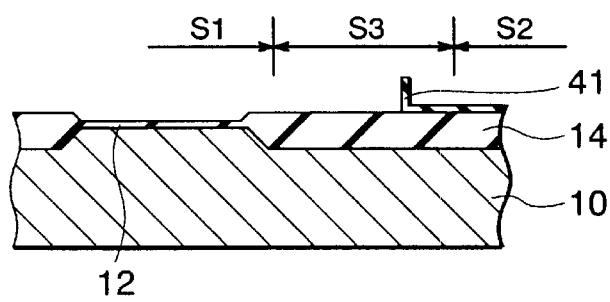
Figure 15C:
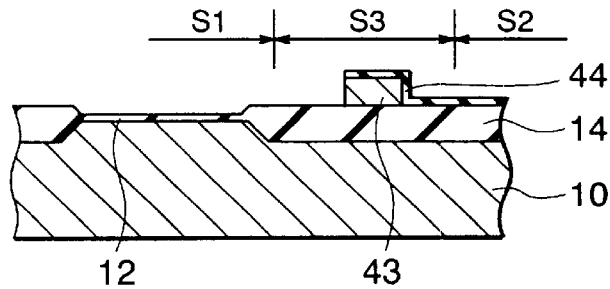
FIG. 15C are cross-sectional views taken along a line I—I and a line G—G respectively in FIG. 15A.

As described above, according to this first embodiment, the resist pattern 18 shown in FIG. 10A and FIG. 10B enables etching and removal of only those regions between memory elements, and the boundary region S3 positioned between the peripheral circuit region S1 and the memory cell region S2 remains entirely covered with the first poly-silicon film. The reason for this requirement is described below. FIG. 15A is different from the present invention, and is a plan view showing one step in a method of manufacturing a nonvolatile semiconductor memory device, wherein the region between a peripheral circuit region S1 and a memory cell region S2 comprises a region where the first poly-silicon film has been removed and a region where the first poly-silicon film still remains (refer to Japanese Patent Application No. Hei 11-016612). FIG. 15B and FIG. 15C are cross-sectional views taken along a line I—I shown in FIG. 15A. FIG. 15A shows a step identical with the first embodiment of the present invention, wherein a first poly-silicon film has been formed on the entire surface, and this first poly-silicon film has then been subjected to patterning using a resist pattern to form a floating gate base layer 220. In this manner, strip-like floating gate base layers 220, which extend in a column direction on top of gate insulation films 12 formed in the memory element formation region, are formed individually on top of each of the gate insulation films 12. Furthermore, the first poly-silicon film from the entire peripheral circuit region S1 and a portion of the boundary region S3 is not removed, and remains surrounding the memory cell region S2. Subsequently, ions are injected for the channel stopper for the element isolating insulation film 14 of the memory cell region S2, and a resist pattern is formed covering the memory cell region S2 to enable removal of the first poly-silicon film from the peripheral circuit region S1. At this point, the edge of the resist pattern should be made to extend beyond the first poly-silicon film formed in the boundary region S3 into the memory cell region S2 so that the resist pattern and the first poly-silicon film overlap with each other. In other words, in the case where a resist pattern shown by the dotted and dashed line 40 of FIG. 15A is formed, if this resist pattern is used as a mask for etching the first poly-silicon film, none of the first poly-silicon film will remain in the boundary region S3. At this time, the ONO film formed on the side wall of the first poly-silicon film has a height equivalent to the thickness of the first poly-silicon film, and will consequently not be completely etched away, but remain as an angular residue 41. There is a possibility that this ONO film reside 41 will peel off during the washing process prior to formation of the gate insulation film 13 and become an unwanted contaminant. As a method of preventing this problem, the edge of the resist mask covering the memory cell region should be formed further towards the peripheral circuit region S1 than the first poly-silicon film formed in the boundary region S3, as shown in FIG. 15B. In other words, a method is possible wherein by forming the resist pattern in the location indicated by the dashed line 42 in FIG. 15A and then using this resist pattern as a mask for etching the first poly-silicon film, the remaining first poly-silicon film will form a ring shape surrounding the memory cell region S2, and ONO film residues 44 can be adhered to this ring shaped poly-silicon film 43, as shown in FIG. 15C. However, this ring shaped poly-silicon film 43 has no function other than bonding the ONO film residues 44, and as such is a wasted region in the layout. In order to prevent the formation of ONO film residues, and moreover make the ring shaped poly-silicon film 43 used for bonding the ONO film unnecessary, the first poly-silicon film must be patterned only between the memory elements of the memory cell region, as shown in FIG. 9A and FIG. 9B, whereas in the boundary region, the first poly-silicon film must be formed over the entire surface.

According to the embodiment of the present invention, when the ONO film 24 on the outside of the memory cell region S2 is removed, the first poly-silicon film remains beneath the ONO film 24 of the peripheral circuit region S1. Consequently, when the ONO film 24 of the peripheral circuit region is removed by dry etching, even if over etching occurs, etching of the silicon substrate 10 can be prevented. Furthermore, because a dummy pattern of the first poly-silicon film does not occur between the memory cell region S2 and the peripheral circuit region S1, the surface region of the chip can be reduced. In addition, in those cases where HSG (hemispherical grained silicon) is formed on the first poly-silicon film, then because the base layers 20 of floating gates adjacent in a column direction are connected, and moreover continue from the memory cell region S2 through to the peripheral circuit region S1, the edges of the base layer 20 are positioned in locations distant from the region which becomes the floating gate. As a result, the surface region dependency observed when the ONO film 24 (the insulation film between the floating gate and the control gate) is formed on the base layer 20 using CVD methods can be avoided, the thickness of the ONO film 24 formed on the floating gate 20a in the memory cell region is uniform, and variations in the memory element characteristics can be suppressed.

Figure 16A:
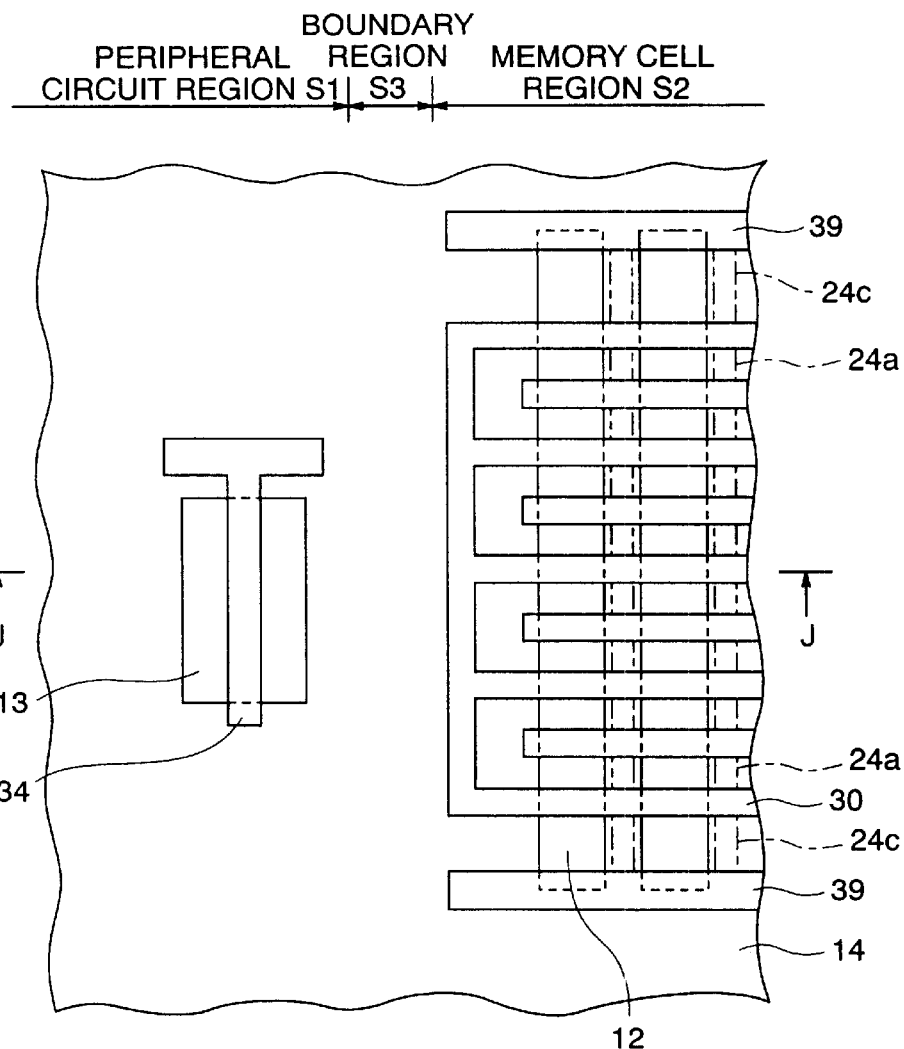
FIG. 16A is a plan view showing a nonvolatile semiconductor memory device according to a second embodiment of the present invention.
Figure 16B:
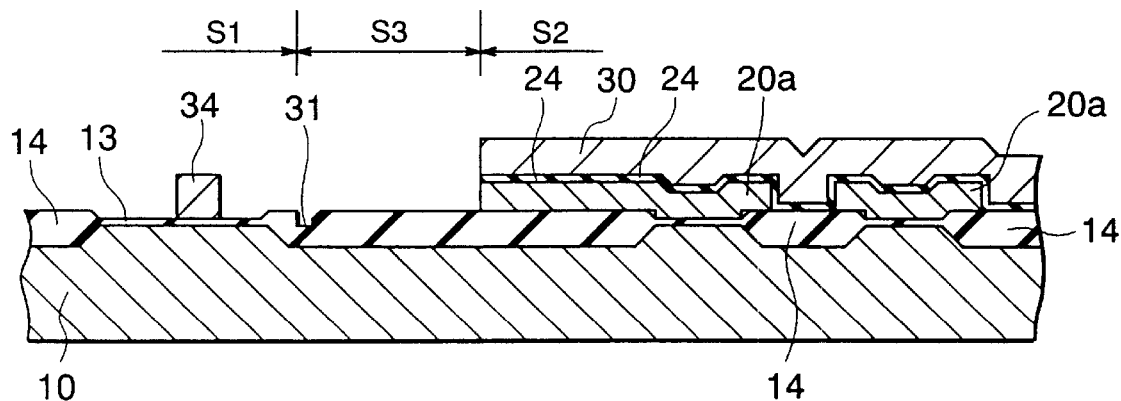
FIG. 16B is a cross-sectional view taken along a line J—J in FIG. 16A.

As follows is a description of a second embodiment of the present invention. FIG. 16A is a plan view showing a nonvolatile semiconductor memory device according to this second embodiment, and FIG. 16B is a cross-sectional view taken along a line J—J in FIG. 16A. In the second embodiment shown in FIG. 16 and FIG. 17, those structural elements which are identical with the first embodiment shown in FIG. 8 are labeled with identical reference numerals, and detailed descriptions of those elements will be omitted.

The ONO film residues 24b, which are generated as traces of the side wall of the floating gate during the formation of the control gate, are finally eliminated by the insulation film etch back process for forming the side wall. However, there is a possibility that these residues may become peeling off during any of the wet processes, such as the step for removing the resist film or the washing step prior to heat treatment, and become unwanted contaminants. In other words, although the ONO film residues 24a are adhered at both ends to the control gate 30 within the region in which the control gate is formed, and are consequently unlikely to peel off, the ONO film resides 24b remaining outside the control gate 30 in the regions between the gate insulation films 12 are isolated, and as such may become peeling off. In order to prevent such peeling off, in this second embodiment a dummy pattern 39 is formed in a position which covers the edges of these ONO film residues 24b left as traces of the floating gate at both sides of the control gate 30.

As shown in FIG. 16A and FIG. 16B, the peripheral circuit region S1 and the memory cell region S2 are formed in an identical manner to the first embodiment, and in the memory cell region S2, the memory elements are arranged in a matrix. A dummy pattern 39 which extends in a row direction is formed on both sides of the control gate 30 of these memory elements, from the same conductive film as the control gate 30. In this second embodiment, ONO film residues 24c will exist outside the region of the control gate 30 immediately following the control gate 30 formation process, and one end of these residues 24c will be adhered to the dummy pattern 39, and the other end to the control gate 30. Furthermore, inside the control gate formation region, ONO film residues 24a are formed along the edges of the element isolating insulation film 14, and both ends of these residues 24a are adhered to the adjacent section of the control gate 30.

Figure 17A:
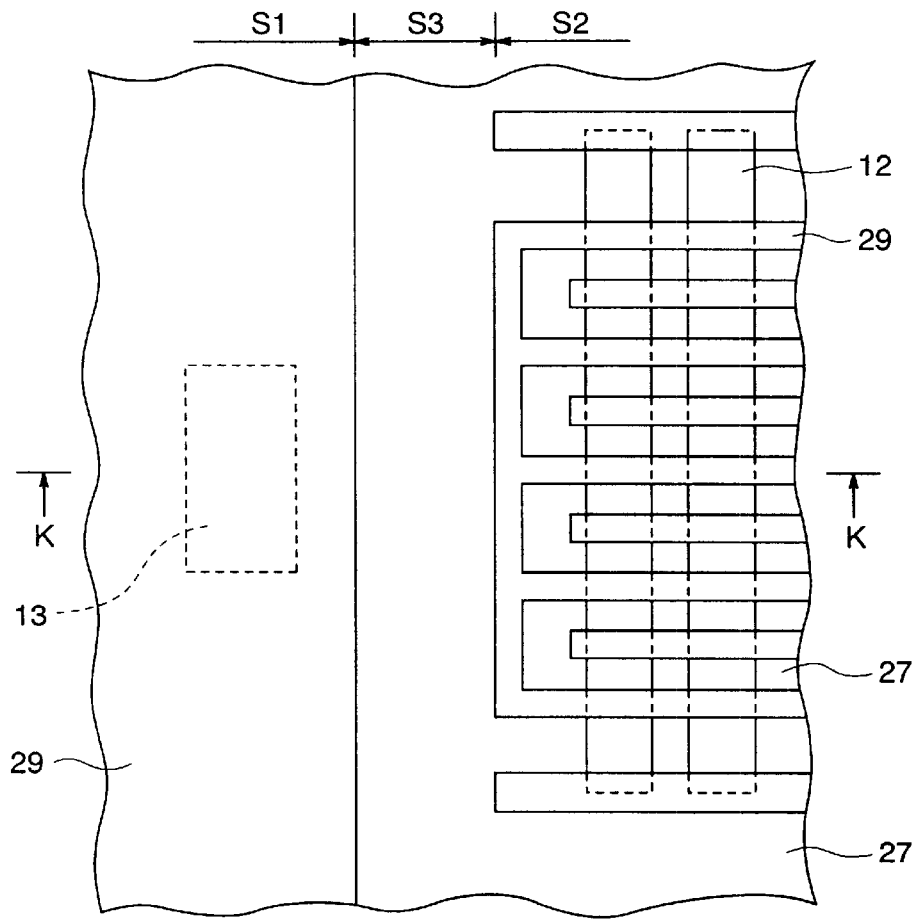
FIG. 17A is a plan view showing one step in a method of manufacturing the nonvolatile semiconductor memory device according to the second embodiment of the present invention.
Figure 17B:
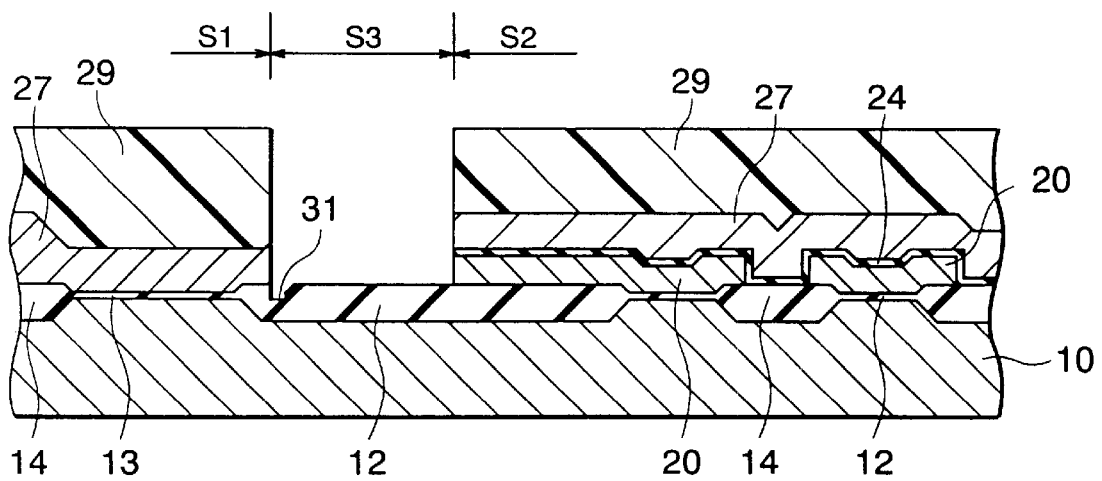
FIG. 17B is a cross-sectional view taken along a line K—K in FIG. 17A.

As follows is a description of a method of manufacturing a nonvolatile semiconductor memory device according to this second embodiment. FIG. 17A is a plan view showing one step in a method of manufacturing the nonvolatile semiconductor memory device according to the second embodiment of the present invention, and FIG. 17B is a cross-sectional view taken along a line K—K in FIG. 17A. A gate insulation film 12 is formed within the peripheral circuit region S1 in a region surrounded by an element isolating insulation film 14, using processes identical with those shown in FIG. 10A and FIG. 10B through to FIG. 12A and FIG. 12B of the first embodiment. Furthermore in the memory cell region S2, an element isolating insulation film 14 is formed which surrounds the memory element formation region, and gate insulation films 12 are formed on the silicon substrate 10 within the regions surrounded by this element isolating insulation film 14. In addition, a first poly-silicon film is deposited, and following the selective removal of only the first poly-silicon film from between the columns of memory elements and the formation of the floating gate base layer 20, an impurity such as boron is injected into the element isolating insulation film 14 in those regions where the base layer 20 has been removed, to generate the same conductivity as the p-type silicon substrate 10. Moreover, an ONO film 24 is then formed on the entire surface, and the ONO film 24, the first poly-silicon film and the gate insulation film 12 are removed from the peripheral circuit region S1 and a gate insulation film 13 formed in the peripheral circuit region S1. A two-layered conductive film 27, with for example a poly-silicon film as the lower layer and a high melting point metal silicide as the upper layer, is then formed on the entire surface.

Subsequently, as shown in FIG. 17A and FIG. 17B, a resist pattern is formed which covers the entire peripheral circuit region S1, and exposes the conductive film 27 with the exception of the control gate and the dummy pattern formation regions of the memory cell region S2. The control gate 30 and the dummy pattern 39 are then subjected to patterning, as shown in FIG. 16A and FIG. 16B. At this time, the exposed sections of the ONO film 24 and the first poly-silicon film are removed, although the ONO film 24 formed on the side wall of the first poly-silicon film in those regions where the element isolating insulation film 14 was removed during the formation of the base layer 20 of the floating gate is relatively high, and is consequently not removed by etching and forms the ONO film residues 24a, 24c. Of these ONO film residues 24a, 24c, the residues 24a within the control gate formation region are adhered to the control gate 30 at both ends, whereas in this second embodiment, because of the formation of the dummy pattern 39, the ONO film residues 24c outside the control gate region are adhered to the control gate 30 at one end, and to the dummy pattern 39 at the other end. The dummy pattern 39, which is formed at the same time as the formation of the control gate 30, is connected to GND during operation of the nonvolatile semiconductor memory device.

In this second embodiment, because both ends of all the remaining ONO film is adhered to either the control gate 30 or the dummy pattern 39, the problems associated with these ONO film residues peeling off and becoming contaminants can be prevented. Furthermore, as was observed for the first embodiment, because the region of the floating gate base layer 20 is large, the thickness of the ONO film 24 formed on the floating gate 20a will be uniform, and so variations in the characteristics of the memory cells in the memory cell region can be suppressed.

As described above, according to the present invention, when the insulation film is removed from between the floating gate and the control gate formed outside the memory cell region, because the first conductive film is formed in the peripheral circuit region, there is no danger of over etching of the silicon substrate, and deterioration in the characteristics of transistors formed in the peripheral circuit region can be prevented. Furthermore, because a dummy pattern is not generated between the memory cell region and the peripheral circuit region, the surface region of the chip can be reduced. Moreover, when CVD methods are used for forming an insulation film on the floating gate between the floating gate and the control gate, the base layer of the floating gate becomes the first conductive film in which only those regions between the columns of memory elements have been removed, and so the thickness of the aforementioned insulation film will be uniform, enabling variations in the memory cell characteristics to be suppressed.

What is claimed is:

1. A nonvolatile semiconductor memory device comprising:
   a memory cell region where a plurality of memory elements is formed, said memory element having a floating gate formed of a first conductive film, an insulation film formed on said floating gate, and a control gate formed of a second conductive film on said insulation film;
   a peripheral circuit region having a transistor with its gate electrode formed of said second conductive film for controlling said memory elements;
   an element isolating insulation film formed between said memory cell region and said peripheral circuit region; and
   a groove formed at a surface of said element isolating insulation film, said groove being formed in said element isolating insulation film in a boundary region between said memory cell region and said peripheral circuit region, said boundary region being defined as the region between a first side edge of the control gate in the memory cell region and a second side edge of the gate electrode in the peripheral circuit region, said groove formed at the second side edge of the boundary region.

2. The nonvolatile semiconductor memory device according to claim 1, wherein said insulation film comprises a silicon oxide film, a silicon nitride film and another silicon oxide film.

3. The nonvolatile semiconductor memory device of claim 1, wherein a dummy pattern of said second conductive film does not occur between said memory cell region and said peripheral circuit region.

4. The nonvolatile semiconductor memory device of claim 1, further comprising:
   a dummy pattern included in the memory cell region of said second conductive material.

5. The nonvolatile semiconductor memory device of claim 4, further comprising:
   insulation film residues having edges covered by said dummy pattern.

6. The nonvolatile semiconductor memory device of claim 1, wherein said memory cell region includes memory elements formed in a matrix arrangement.

7. The nonvolatile semiconductor memory device of claim 6, wherein a diffusion layer of said memory elements in a column is shared between memory elements included in said column.

8. The nonvolatile semiconductor memory device of claim 6, wherein said memory cell region includes said element isolating insulation film that isolates columns of said memory elements into parallel strips.

9. The nonvolatile semiconductor memory device of claim 1, wherein said boundary region surrounds said memory cell region.

10. The nonvolatile semiconductor memory device of claim 1, wherein said memory cell region comprises a plurality of parallel strips partitioned off by said element isolating insulation film.

11. The nonvolatile semiconductor memory device of claim 10, wherein a gate insulation film is formed on a silicon substrate in said strips.

12. The nonvolatile semiconductor memory device of claim 11, wherein said control gate is formed from a plurality of lines that run in a direction perpendicular to the lengthwise direction of said strips.

13. The nonvolatile semiconductor memory device of claim 12, wherein said control gate is formed in a comb shape where tips of every second control gate line of said plurality of lines are connected.

14. The nonvolatile semiconductor memory device of claim 1, wherein said peripheral circuit region includes a gate insulation film formed on a silicon substrate and is surrounded by said element isolating insulation film.

15. The nonvolatile semiconductor memory device of claim 14, wherein said gate electrode is formed on top of said gate insulation film.

16. The nonvolatile semiconductor memory device of claim 15, wherein ends of said gate electrode extend out from above said gate insulation film to positions above said element isolating insulation film.

17. The nonvolatile semiconductor memory device of claim 1, wherein said boundary region includes at an exposed surface only element isolation insulation film.

* * * * *